(12) United States Patent
Isokawa

(10) Patent No.: US 10,845,777 B2
(45) Date of Patent: Nov. 24, 2020

(54) TEACHING DEVICE AND TEACHING METHOD

(71) Applicant: EBARA CORPORATION, Tokyo (JP)

(72) Inventor: Hidetatsu Isokawa, Tokyo (JP)

(73) Assignee: EBARA CORPORATION, Tokyo (JP)

( * ) Notice: Subject to any disclaimer, the term of this patent is extended or adjusted under 35 U.S.C. 154(b) by 0 days.

(21) Appl. No.: 15/474,158

(22) Filed: Mar. 30, 2017

(65) Prior Publication Data
US 2017/0285609 A1  Oct. 5, 2017

(30) Foreign Application Priority Data
Mar. 31, 2016 (JP) ................. 2016-072546

(51) Int. Cl.
*G05B 19/402* (2006.01)

(52) U.S. Cl.
CPC .. *G05B 19/402* (2013.01); *G05B 2219/42129* (2013.01); *G05B 2219/45031* (2013.01)

(58) Field of Classification Search
CPC ........ G05B 19/402; G05B 2219/45031; G05B 2219/42129; H01L 21/67778; H01L 21/67259
See application file for complete search history.

(56) References Cited

U.S. PATENT DOCUMENTS 5,824,153 A * 10/1998 Suda ................ C30B 15/00
                                              117/208
5,981,966 A * 11/1999 Honma ............ H01L 21/67778
                                              250/559.33
6,036,582 A    3/2000 Aizawa et al.
6,633,046 B1 * 10/2003 Mitchell ............. B25F 5/001
                                              250/398
2005/0201424 A1  9/2005 Yoshida et al.
(Continued)

FOREIGN PATENT DOCUMENTS

CN    1774607 A    5/2006
CN    1934695 A    3/2007
(Continued)

OTHER PUBLICATIONS

Japanese Office action issued in Japanese Patent Application No. 2016-072546 dated Jul. 16, 2019.
(Continued)

*Primary Examiner* — Mohammad Ali
*Assistant Examiner* — Vincent W Chang
(74) *Attorney, Agent, or Firm* — Pearne & Gordon LLP

(57) ABSTRACT

A teaching apparatus is provided with an arm-side position sensor attached to arms, a dummy wafer placed on a stage, a dummy-wafer-side position sensor attached to the dummy wafer, and a signal receiver configured to receive a position signal from the arm-side position sensor to determine a position coordinate of the arm-side position sensor, and receive a position signal from the dummy-wafer-side position sensor to determine a position coordinate of the dummy-wafer-side position sensor. A control part, based on the position coordinate of the dummy-wafer-side position sensor, calculates a position coordinate of the arm-side position sensor when the arms hold the wafer, and moves the arms such that the arm-side position sensor moves to the calculated position coordinate.

14 Claims, 15 Drawing Sheets

(56) References Cited

U.S. PATENT DOCUMENTS

| | | | |
|---|---|---|---|
| 2006/0106497 A1 | 5/2006 | Ishikawa et al. | |
| 2007/0150100 A1* | 6/2007 | Saraliev | B25J 9/1692 700/245 |
| 2007/0199860 A1 | 8/2007 | Asari et al. | |
| 2007/0273892 A1 | 11/2007 | Asari et al. | |
| 2009/0051370 A1* | 2/2009 | Doki | G03F 7/7075 324/658 |
| 2009/0067959 A1 | 3/2009 | Takahashi et al. | |
| 2009/0305612 A1 | 12/2009 | Miyazaki et al. | |
| 2011/0130864 A1 | 6/2011 | Hirota | |

FOREIGN PATENT DOCUMENTS

| | | |
|---|---|---|
| CN | 101373728 A | 2/2009 |
| CN | 101390197 A | 3/2009 |
| CN | 101599423 A | 12/2009 |
| CN | 102046338 A | 5/2011 |
| JP | H04-159094 A | 6/1992 |
| JP | H10-340870 A | 12/1998 |
| JP | 2004-276151 A | 10/2004 |
| JP | 2005-123261 A | 5/2005 |
| JP | 2005-260176 A | 9/2005 |
| JP | 2008-094560 A | 4/2008 |
| KR | 10-2005-0023424 A | 3/2005 |
| KR | 10-2008-0106933 A | 12/2008 |
| KR | 10-20120106296 A | 9/2012 |
| TW | 368689 B | 9/1999 |
| WO | 2009-145082 A1 | 12/2009 |

OTHER PUBLICATIONS

Chinese Office Action issued in Patent Application No. 201710206657.7 dated May 14, 2020.

Notice of Allowance issued in Korean Patent Application No. 10-2017-0040610 dated Feb. 26, 2020.

* cited by examiner

10

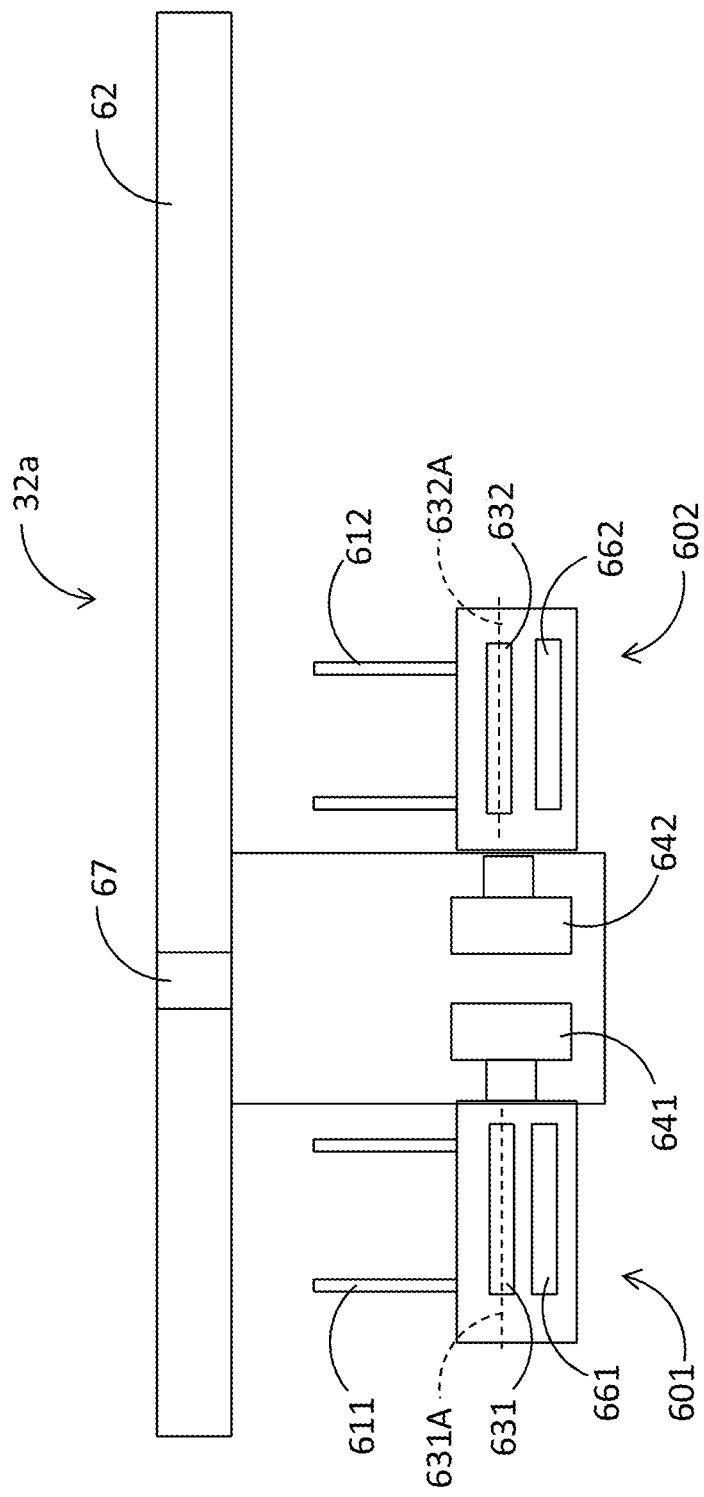

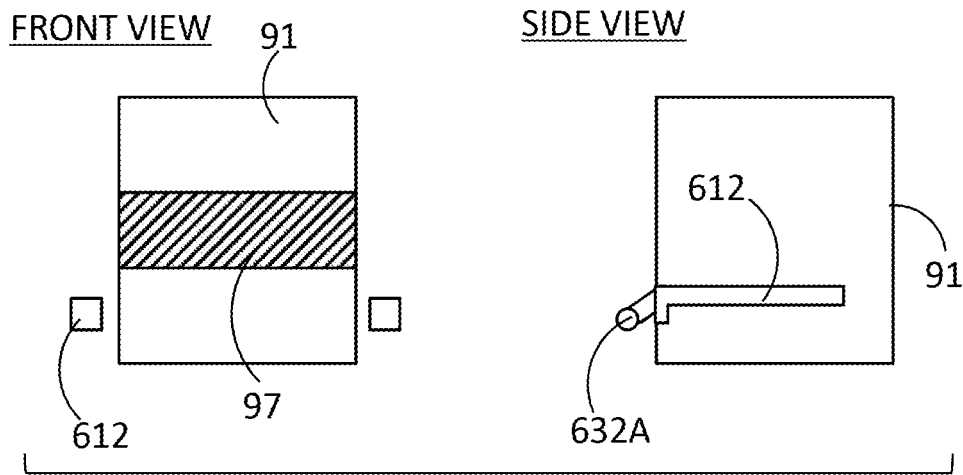
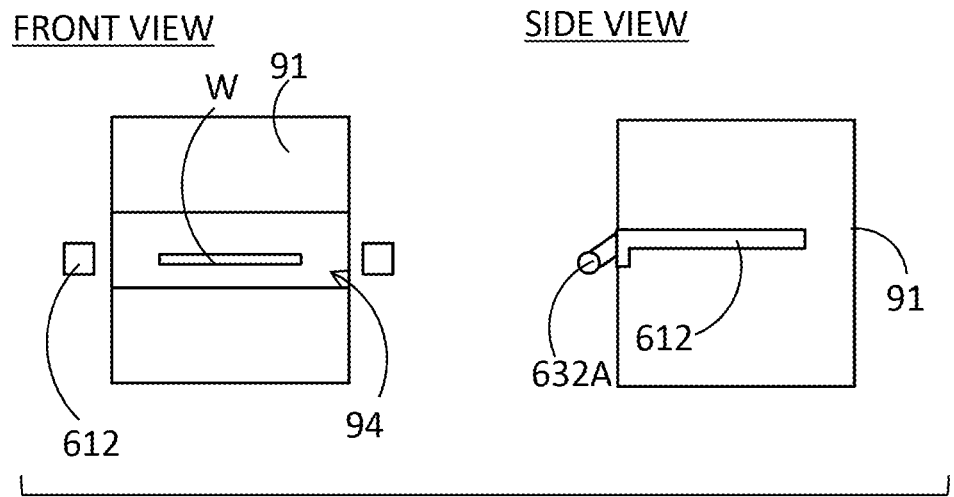

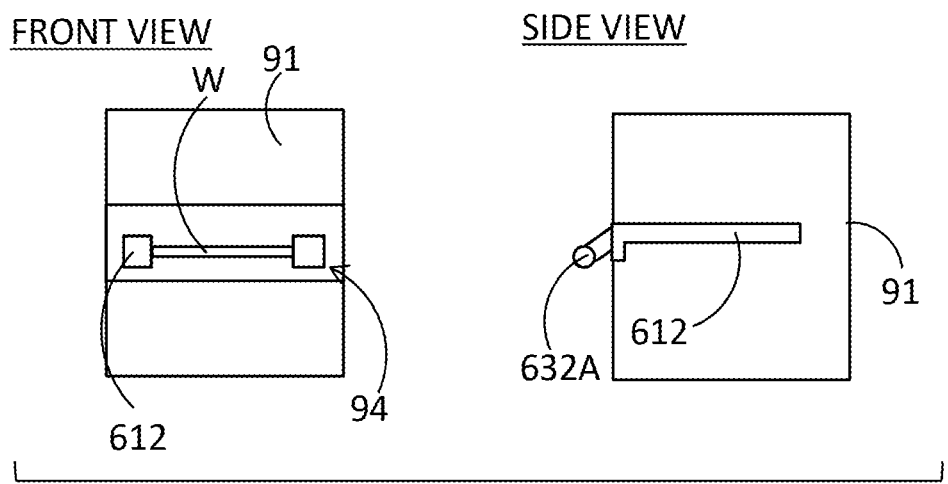

TEACHING DEVICE AND TEACHING METHOD

CROSS-REFERENCE TO RELATED APPLICATIONS

This application claims the benefit of Japanese Priority Patent Application JP 2016-072546 filed on Mar. 31, 2016, the entire contents of which are incorporated herein by reference.

FIELD

The present technology relates to a teaching apparatus and a teaching method for teaching a pair of arms configured to hold a wafer.

BACKGROUND AND SUMMARY

In recent years, with the progress of the higher integration of semiconductor devices, circuit wiring is becoming finer, and an inter-wiring distance is becoming narrower. In manufacturing of a semiconductor device, many kinds of materials are repeatedly formed in a film shape on a silicon wafer, to form a layered structure. In order to form this layered structure, a technology to planarize a surface of the wafer is critical. As such a means of planarizing the surface of a wafer, a polishing device for performing a chemical-mechanical polishing (CMP) (also referred to as a chemical-mechanical polishing device) have been used widely.

The chemical-mechanical polishing (CMP) device is generally provided with a polishing table attached with a polishing pad, a top ring for holding a wafer, and a nozzle for supplying polishing liquid on the polishing pad. While the nozzle supplies the polishing liquid on the polishing pad, the top ring presses the wafer to the polishing pad, and the top ring and the polishing table are relatively moved, thereby to polish the wafer to planarize the surface of the wafer.

A substrate processing apparatus is an apparatus that has a function of cleaning and drying a polished wafer, in addition to such a CMP device. In such a substrate processing apparatus, reduction of its start-up time and maintenance time is needed. However, when a pair of openable/closable arms hold a wafer to transport in a conventional substrate processing apparatus, a work for teaching the wafer position to this mechanical mechanism (teaching work) needs to be done by a person, which requires much time for start-up and maintenance. Additionally, there is also a problem that accuracy may vary depending on an experience or a skill of a worker who performs the teaching work.

JP 2005-123261 A proposes an apparatus that teaches a wafer position to a robot having a Y-shaped hand. However, an apparatus that teaches a wafer position to a mechanical mechanism configured to hold and transport a wafer with a pair of openable/closable arms is not known.

It is desired to provide a teaching apparatus and a teaching method that can teach a wafer position to a mechanical mechanism configured to hold and transport a wafer with a pair of openable/closable arms in a short time without variation in accuracy.

A teaching apparatus according to one embodiment is provided with a stage on which a wafer is placed, a pair of openable/closable arms configured to hold the wafer, an arm-moving mechanism configured to move the pair of arms with respect to the stage, a control part configured to control an operation of the arm-moving mechanism, an arm-side position sensor attached to the pair of arms and configured to transmit a position signal, a dummy wafer placed on the stage, a dummy-wafer-side position sensor attached to the dummy wafer and configured to transmit a position signal, and a signal receiver configured to receive the position signal from the arm-side position sensor to determine a position coordinate of the arm-side position sensor, and receive the position signal from the dummy-wafer-side position sensor to determine a position coordinate of the dummy-wafer-side position sensor.

The control part, based on the position coordinate of the dummy-wafer-side position sensor, calculates a position coordinate of the arm-side position sensor when the pair of arms hold the wafer, and controls the operation of the arm-moving mechanism to move the pair of arms such that the arm-side position sensor moves to the calculated position coordinate, while checking the position coordinate, of the arm-side position sensor, that is determined from the position signal of the arm-side position sensor.

A teaching method according to one embodiment is provided with the steps of receiving a position signal from a dummy-wafer-side position sensor that is attached to a dummy wafer placed on a stage, to determine a position coordinate of the dummy-wafer-side position sensor, receiving a position signal from an arm-side position sensor attached to a pair of arms, to determine a position coordinate of the arm-side position sensor, based on the position coordinate of the dummy-wafer-side position sensor, calculating a position coordinate of the arm-side position sensor when the pair of arms hold the wafer, and moving the pair of arms such that the arm-side position sensor moves to the calculated position coordinate.

A cleaning device according to one embodiment is provided with a stage on which a wafer is placed, a cleaning mechanism configured to clean the wafer on the stage, a pair of openable/closable arms configured to hold the wafer, an arm-moving mechanism configured to move the pair of arms with respect to the stage, a control part configured to control an operation of the arm-moving mechanism, an arm-side position sensor attached to the pair of arms and configured to transmit a position signal, a dummy wafer placed on the stage, a dummy-wafer-side position sensor attached to the dummy wafer and configured to transmit a position signal, and a signal receiver configured to receive the position signal from the arm-side position sensor to determine a position coordinate of the arm-side position sensor, and receive the position signal from the dummy-wafer-side position sensor to determine a position coordinate of the dummy-wafer-side position sensor.

The control part, based on the position coordinate of the dummy-wafer-side position sensor, calculates a position coordinate of the arm-side position sensor when the pair of arms hold the wafer, and controls the operation of the arm-moving mechanism to move the pair of arms such that the arm-side position sensor moves to the calculated position coordinate.

A storage medium according to one embodiment non-transitory stores the following program, and the program is configured to cause a computer to execute the steps of receiving a position signal from a dummy-wafer-side position sensor that is attached to a dummy wafer placed on a stage, to determine a position coordinate of the dummy-wafer-side position sensor, receiving a position signal from an arm-side position sensor attached to a pair of arms, to determine a position coordinate of the arm-side position sensor, based on the position coordinate of the dummy-wafer-side position sensor, calculating a position coordinate of the arm-side position sensor when the pair of arms hold the wafer, and moving the pair of arms such that the arm-side position sensor moves to the calculated position coordinate.

A maintenance kit according to one embodiment is provided with an arm-side position sensor attached to a pair of arms and configured to transmit a position signal, a dummy wafer placed on a stage, a dummy-wafer-side position sensor attached to the dummy wafer and configured to transmit a position signal, and a signal receiver configured to receive the position signal from the arm-side position sensor to determine a position coordinate of the arm-side position sensor, and receive the position signal from the dummy-wafer-side position sensor to determine a position coordinate of the dummy-wafer-side position sensor.

BRIEF DESCRIPTION OF DRAWINGS

FIG. 4 is a perspective view illustrating a cleaning-part transport mechanism of a first cleaning unit of the cleaning part illustrated in FIG. 1;

FIG. 5C is an exemplary view for explaining an operation of the second wafer-holding mechanism of the cleaning-part transport mechanism illustrated in FIG. 4;

FIG. 5D is an exemplary view for explaining an operation of the second wafer-holding mechanism of the cleaning-part transport mechanism illustrated in FIG. 4;

FIG. 5E is an exemplary view for explaining an operation of the second wafer-holding mechanism of the cleaning-part transport mechanism illustrated in FIG. 4;

DETAILED DESCRIPTION OF NON-LIMITING EXAMPLE EMBODIMENTS

Figure 1:
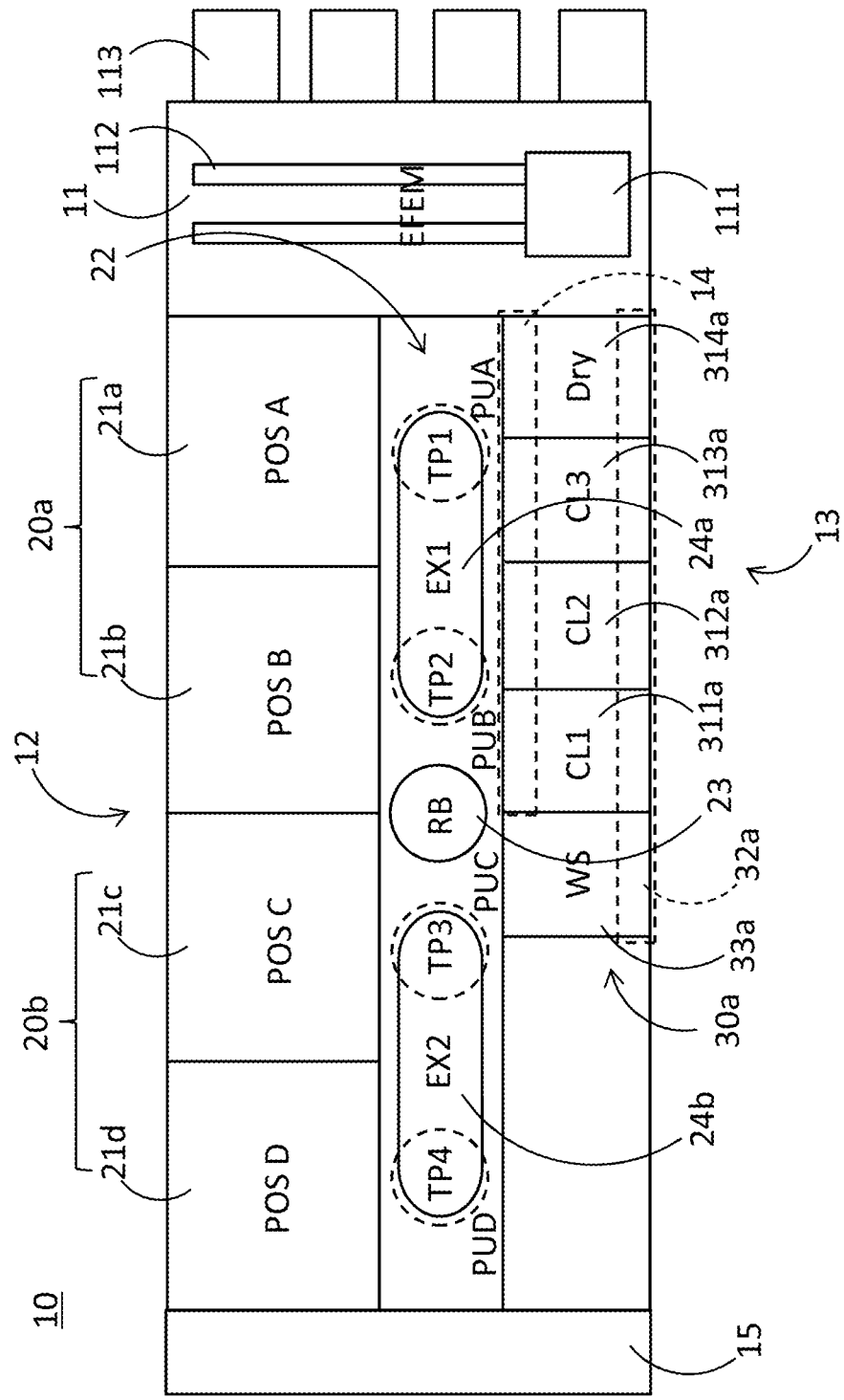
FIG. 1 is a plan view illustrating an entire configuration of a substrate processing apparatus according to one embodiment.

Embodiments are described below. It should be noted that, in the following descriptions and drawings used in the following descriptions, parts capable of being identically configured are denoted by identical reference numerals, and will not be described in duplication.

A teaching apparatus according to one embodiment is provided with a stage on which a wafer is placed, a pair of openable/closable arms configured to hold the wafer, an arm-moving mechanism configured to move the pair of arms with respect to the stage, a control part configured to control an operation of the arm-moving mechanism, an arm-side position sensor attached to the pair of arms and configured to transmit a position signal, a dummy wafer placed on the stage, a dummy-wafer-side position sensor attached to the dummy wafer and configured to transmit a position signal, and a signal receiver configured to receive the position signal from the arm-side position sensor to determine a position coordinate of the arm-side position sensor, and receive the position signal from the dummy-wafer-side position sensor to determine a position coordinate of the dummy-wafer-side position sensor.

The control part, based on the position coordinate of the dummy-wafer-side position sensor, calculates a position coordinate of the arm-side position sensor when the pair of arms hold the wafer, and controls the operation of the arm-moving mechanism to move the pair of arms such that the arm-side position sensor moves to the calculated position coordinate, while checking the position coordinate, of the arm-side position sensor, that is determined from the position signal of the arm-side position sensor.

According to the teaching apparatus described above, the signal receiver receives a position signal from the arm-side position sensor to determine a position coordinate of the arm-side position sensor, and receives a position signal from the dummy-wafer-side position sensor to determine a position coordinate of the dummy-wafer-side position sensor. Then, the control part, based on the position coordinate of the dummy-wafer-side position sensor, calculates a position coordinate of the arm-side position sensor when the pair of arms hold the wafer, and controls the operation of the arm-moving mechanism to move the pair of arms such that the arm-side position sensor moves to the calculated position coordinate, while checking the position coordinate, of the arm-side position sensor, that is determined from the position signal of the arm-side position sensor. As a result, the pair of arms can be automatically moved to the wafer position on the stage, without complicated work that a person guides the pair of arms to the wafer position on the stage while visually checking the position. Therefore, time required for a teaching work can be remarkably shortened, and variation in accuracy of the work can be prevented.

The teaching apparatus described above is further provided with a proximity sensor attached to one or both of the dummy wafer and the pair of arms and configured to output a proximity amount of the pair of arms with respect to the dummy wafer. The control part, after moving the pair of arms such that the arm-side position sensor moves to the calculated position coordinate, may control the operation of the arm-moving mechanism to adjust the position of the pair of arms such that the proximity amount approaches a predetermined value.

In such an aspect, the teaching work can be performed with finer accuracy than measurement accuracy of a position sensor.

In the teaching apparatus described above, the pair of arms may be attached with a plurality of the arm-side position sensors.

In such an aspect, when there is an assembly defect in the pair of arms, the problem can be found out by receiving a position signal from each of the arm-side position sensors to determine a position coordinate of each of the arm-side position sensors, and comparing the determined position coordinates with each other.

In the teaching apparatus described above, the arm-side position sensor and the dummy-wafer-side position sensor may be three-dimensional position sensors.

In such an aspect, the teaching work can be performed in a short time without variation in accuracy, with respect to all directions in a three-dimensional space.

A teaching method according to one embodiment is provided with the steps of receiving a position signal from a dummy-wafer-side position sensor that is attached to a dummy wafer placed on a stage, to determine a position coordinate of the dummy-wafer-side position sensor, receiving a position signal from an arm-side position sensor attached to a pair of arms, to determine a position coordinate of the arm-side position sensor, based on the position coordinate of the dummy-wafer-side position sensor, calculating a position coordinate of the arm-side position sensor when the pair of arms hold the wafer, and moving the pair of arms such that the arm-side position sensor moves to the calculated position coordinate.

The teaching method described above receives a position signal from the arm-side position sensor to determine a position coordinate of the arm-side position sensor, and receives a position signal from the dummy-wafer-side position sensor to determine a position coordinate of the dummy-wafer-side position sensor. Then, based on the position coordinate of the dummy-wafer-side position sensor, calculates a position coordinate of the arm-side position sensor when the pair of arms hold the wafer, and moves the pair of arms such that the arm-side position sensor moves to the calculated position coordinate. As a result, the pair of arms can be moved to the wafer position on the stage, without complicated work that a person guides the pair of arms to the wafer position while visually checking the position. Therefore, time required for a teaching work can be remarkably shortened, and variation in accuracy of the work can be prevented.

The teaching method described above may be further provided with a step of, after moving the pair of arms such that the arm-side position sensor moves to the calculated position coordinate, acquiring a proximity amount of the pair of arms with respect to the dummy wafer from a proximity sensor attached to one or both of the dummy wafer and the pair of arms, and adjusting a position of the pair of arms such that the proximity amount approaches a predetermined value.

In such an aspect, the teaching work can be performed with finer accuracy than measurement accuracy of a position sensor.

In the teaching method described above, the pair of arms may be attached with a plurality of the arm-side position sensors.

In such an aspect, when there is an assembly defect in the pair of arms, the problem can be found out by receiving a position signal from each of the arm-side position sensors to determine a position coordinate of each of the arm-side position sensors, and comparing the determined position coordinates with each other.

In the teaching method described above, the arm-side position sensor and the dummy-wafer-side position sensor may be three-dimensional position sensors.

In such an aspect, the teaching work can be performed in a short time without variation in accuracy, with respect to all directions in a three-dimensional space.

A cleaning device according to one embodiment is provided with a stage on which a wafer is placed, a cleaning mechanism configured to clean the wafer on the stage, a pair of openable/closable arms configured to hold the wafer, an arm-moving mechanism configured to move the pair of arms with respect to the stage, a control part configured to control an operation of the arm-moving mechanism, an arm-side position sensor attached to the pair of arms and configured to transmit a position signal, a dummy wafer placed on the stage, a dummy-wafer-side position sensor attached to the dummy wafer and configured to transmit a position signal, and a signal receiver configured to receive the position signal from the arm-side position sensor to determine a position coordinate of the arm-side position sensor, and receive the position signal from the dummy-wafer-side position sensor to determine a position coordinate of the dummy-wafer-side position sensor.

The control part, based on the position coordinate of the dummy-wafer-side position sensor, calculates a position coordinate of the arm-side position sensor when the pair of arms hold the wafer, and controls the operation of the arm-moving mechanism to move the pair of arms such that the arm-side position sensor moves to the calculated position coordinate.

A storage medium according to one embodiment non-transitory stores the following program, and the program is configured to cause a computer to execute the steps of receiving a position signal from a dummy-wafer-side position sensor that is attached to a dummy wafer placed on a stage, to determine a position coordinate of the dummy-wafer-side position sensor, receiving a position signal from an arm-side position sensor attached to a pair of arms, to determine a position coordinate of the arm-side position sensor, based on the position coordinate of the dummy-wafer-side position sensor, calculating a position coordinate of the arm-side position sensor when the pair of arms hold the wafer, and moving the pair of arms such that the arm-side position sensor moves to the calculated position coordinate.

A maintenance kit according to one embodiment is provided with an arm-side position sensor attached to a pair of arms and configured to transmit a position signal, a dummy wafer placed on a stage, a dummy-wafer-side position sensor attached to the dummy wafer and configured to transmit a position signal, and a signal receiver configured to receive the position signal from the arm-side position sensor to determine a position coordinate of the arm-side position sensor, and receive the position signal from the dummy-wafer-side position sensor to determine a position coordinate of the dummy-wafer-side position sensor.

<Substrate Processing Apparatus>

Figure 2:
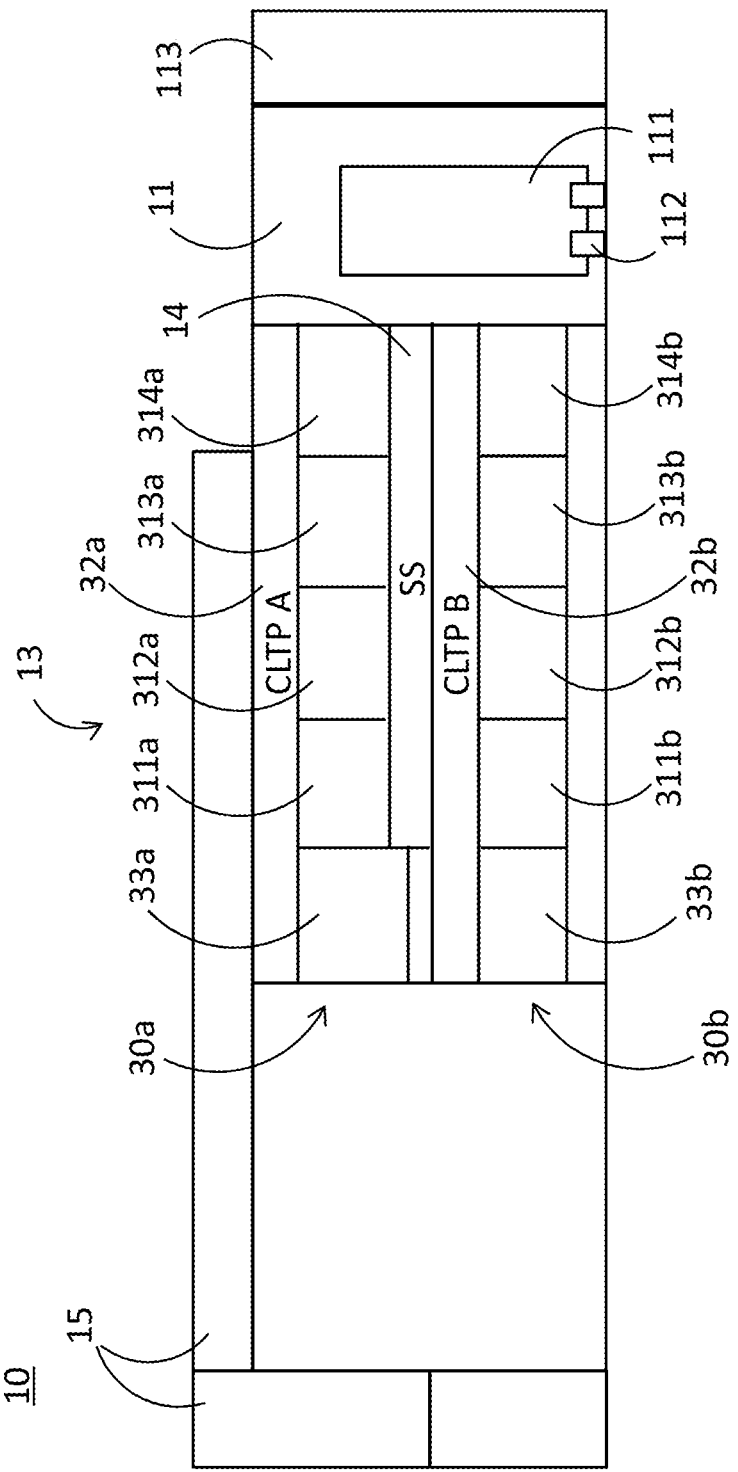
FIG. 2 is a side view of the substrate processing apparatus illustrated in FIG. 1, viewed from a cleaning-part side.

FIG. 1 is a plan view illustrating an entire configuration of a substrate processing apparatus using a teaching apparatus according to one embodiment, and FIG. 2 is a side view of a polishing device illustrated in FIG. 1, viewed from a cleaning-part side. As illustrated in FIGS. 1 and 2, the substrate processing apparatus 10 according to the embodiment is provided with a housing with a substantially rectangular shape in plan view, and an inside of the housing is partitioned into a loading/unloading part 11, a polishing part 12, a cleaning part 13, and a transporting part 14, by partition walls. Each of these the loading/unloading part 11, the polishing part 12, the cleaning part 13, and the transporting part 14 is independently assembled and independently evacuated. The substrate processing apparatus 10 is also provided with a control part 15 (also referred to as a control panel) configured to control operations of the loading/unloading part 11, the polishing part 12, the cleaning part 13, and the transporting part 14.

The loading/unloading part 11 is provided with a plurality of (four in the illustrated example) front loading parts 113 mounted with a wafer cassette that stocks many wafers (substrates) W. These front loading parts 113 are arranged adjacently in a width direction (vertical direction to a longitudinal direction) of the substrate processing apparatus 10. The front loading parts 113 can be mounted with an open cassette, a SMIF (Standard Manufacturing Interface) pod, or a FOUP (Front Opening Unified Pod). Each of the SMIF and the FOUP is a hermetically sealed container which houses a wafer cassette inside and is covered with a partition wall and thus can keep independent internal environment isolated from an external space.

In the loading/unloading part 11, a traveling mechanism 112 is laid along an arrangement direction of the front loading parts 113, and on this traveling mechanism 112, there is installed a transport robot 111 movable along the arrangement direction of the front loading parts 113. The transport robot 111 can have access to the wafer cassette mounted in the front loading parts 113, by moving on the traveling mechanism 112.

The transporting part 14 is an area for transporting a wafer before polishing from the loading/unloading part 11 to the polishing part 12, and is provided to extend along the longitudinal direction of the substrate processing apparatus 10. In this embodiment, the transporting part 14 has a slide stage (not shown) configured to hold the wafer W, and a stage-moving mechanism (not shown) configured to move the slide stage linearly along the longitudinal direction.

Among these, the slide stage is provided with four pins projecting upward, on its outer periphery. The wafer W that is placed on the slide stage by the transport robot 111 of the loading/unloading part 11 is supported on the slide stage, with its outer peripheral edge guided and positioned by the four pins. These pins are formed of a resin such as a polypropylene (PP), a polychlorotrifluoroethylene (PCTFE), or a polyetheretherketone (PEEK).

As the stage-moving mechanism, for example, a motor drive mechanism using a ball screw, or an air cylinder is used. It is preferable to use a rod-less cylinder as the stage-moving mechanism, since dust rising from the sliding part can be prevented. The slide stage is fixed to a movable part of the stage-moving mechanism, and moved linearly along the longitudinal direction by power applied from the stage-moving mechanism.

The polishing part 12 is an area where the wafer W is polished, and has a first polishing unit 20a having a first polishing device 21a and a second polishing device 21b, a second polishing unit 20b having a third polishing device 21c and a fourth polishing device 21d, and a polishing-part transport mechanism 22 arranged adjacent to the transporting part 14, and each of the first and second polishing units 20a and 20b. The polishing-part transport mechanism 22 is disposed between the transporting part 14, and the first and second polishing units 20a and 20b, in the width direction of the substrate processing apparatus 10.

The first polishing device 21a, the second polishing device 21b, the third polishing device 21c, and the fourth polishing device 21d are arranged along the longitudinal direction of the substrate processing apparatus 10. Each of the first polishing device 21a, the second polishing device 21b, the third polishing device 21c, and the fourth polishing device 21d has a polishing table (not shown) that is attached with a polishing pad having a polishing surface, a top ring (not shown) configured to hold the wafer W and polish the wafer W while pressing the wafer W to the polishing pad on the polishing table, a polishing-liquid supply nozzle (not shown) configured to supply polishing liquid (also referred to as slurry) or dressing liquid (e.g. pure water) to the polishing pad, a dresser (not shown) configured to dress the polishing surface of the polishing pad, and an atomizer (not shown) configured to atomize and spray a mixed gas of liquid (e.g. pure water) and gas (e.g. a nitrogen gas), or liquid (e.g. pure water) onto a polishing surface.

The top ring of the first polishing device 21a is moved between a polishing position and a first substrate-transport position TP1 by a swing operation of a top-ring head, and the wafer is transferred to the first polishing device 21*a* at the first substrate-transport position TP1. Similarly, the top ring of the second polishing device 21*b* is moved between a polishing position and a second substrate-transport position TP2 by a swing operation of a top-ring head, and the wafer is transferred to the second polishing device 21*b* at the second substrate-transport position TP2, the top ring of the third polishing device 21*c* is moved between a polishing position and a third substrate-transport position TP3 by a swing operation of a top-ring head, and the wafer is transferred to the third polishing device 21*c* at the third substrate-transport position TP3, and the top ring of the fourth polishing device 21*d* is moved between a polishing position and a fourth substrate-transport position TP4 by a swing operation of a top-ring head, and the wafer is transferred to the fourth polishing device 21*d* at the fourth substrate-transport position TP4.

The polishing-part transport mechanism 22 has a first transport unit 24*a* configured to transport the wafer W to the first polishing unit 20*a*, a second transport unit 24*b* configured to transport the wafer W to the second polishing unit 20*b*, and a transport robot 23 disposed between the first transport unit 24*a* and the second transport unit 24*b* and configured to transfer the wafer between the transporting part 14 and the first and second transport units 24*a* and 24*b*. In the illustrated example, the transport robot 23 is disposed substantially in a center of a housing of the substrate processing apparatus 10. The wafers W that are continuously transported from the transporting part 14 to the polishing part 12 are distributed to the first transport unit 24*a* and the second transport unit 24*b* by the transport robot 23.

A wafer transferred to the first transport unit 24*a* is transported to the first polishing device 21*a* or the second polishing device 21*b*, to be polished. Then, the wafer polished at the first polishing device 21*a* or the second polishing device 21*b* is returned to the transport robot 23 via the first transport unit 24*a*. Similarly, a wafer transferred to the second transport unit 24*b* is transported to the third polishing device 21*c* or the fourth polishing device 21*d*, to be polished. Then, the wafer polished at the third polishing device 21*c* or the fourth polishing device 21*d* is returned to the transport robot 23 via the second transport unit 24*b*. The transport robot 23 transports the wafer received from the first transport unit 24*a* and the second transport unit 24*b*, to the cleaning part 13.

The cleaning part 13 is an area for cleaning a polished wafer, and has a first cleaning unit 30*a* and a second cleaning unit 30*b* that are vertically arranged in two stages. The transporting part 14 described above is disposed between the first cleaning unit 30*a* and the second cleaning unit 30*b*. The vertically superposed arrangement of the first cleaning unit 30*a*, the transporting part 14, and the second cleaning unit 30*b* provides an advantage of a small footprint.

As illustrated in FIG. 2, the first cleaning unit 30*a* has a plurality of (four in the illustrated example) cleaning modules 311*a*, 312*a*, 313*a*, and 314*a*, a wafer station 33*a*, and a cleaning-part transport mechanism 32*a* configured to transport a wafer W between the wafer station 33*a* and each of the cleaning modules 311*a* to 314*a*. The plurality of cleaning module 311*a* to 314*a* and the wafer station 33*a* are arranged in series along the longitudinal direction of the substrate processing apparatus 10.

Similarly, the second cleaning unit 30*b* has a plurality of (four in the illustrated example) cleaning modules 311*b*, 312*b*, 313*b*, and 314*b*, a wafer station 33*b*, and a cleaning-part transport mechanism 32*b* configured to transport a wafer W between the wafer station 33*b* and each of the cleaning modules 311*b* to 314*b*. The plurality of cleaning module 311*b* to 314*b* and the wafer station 33*b* are arranged in series along the longitudinal direction of the substrate processing apparatus 10.

Figure 3:
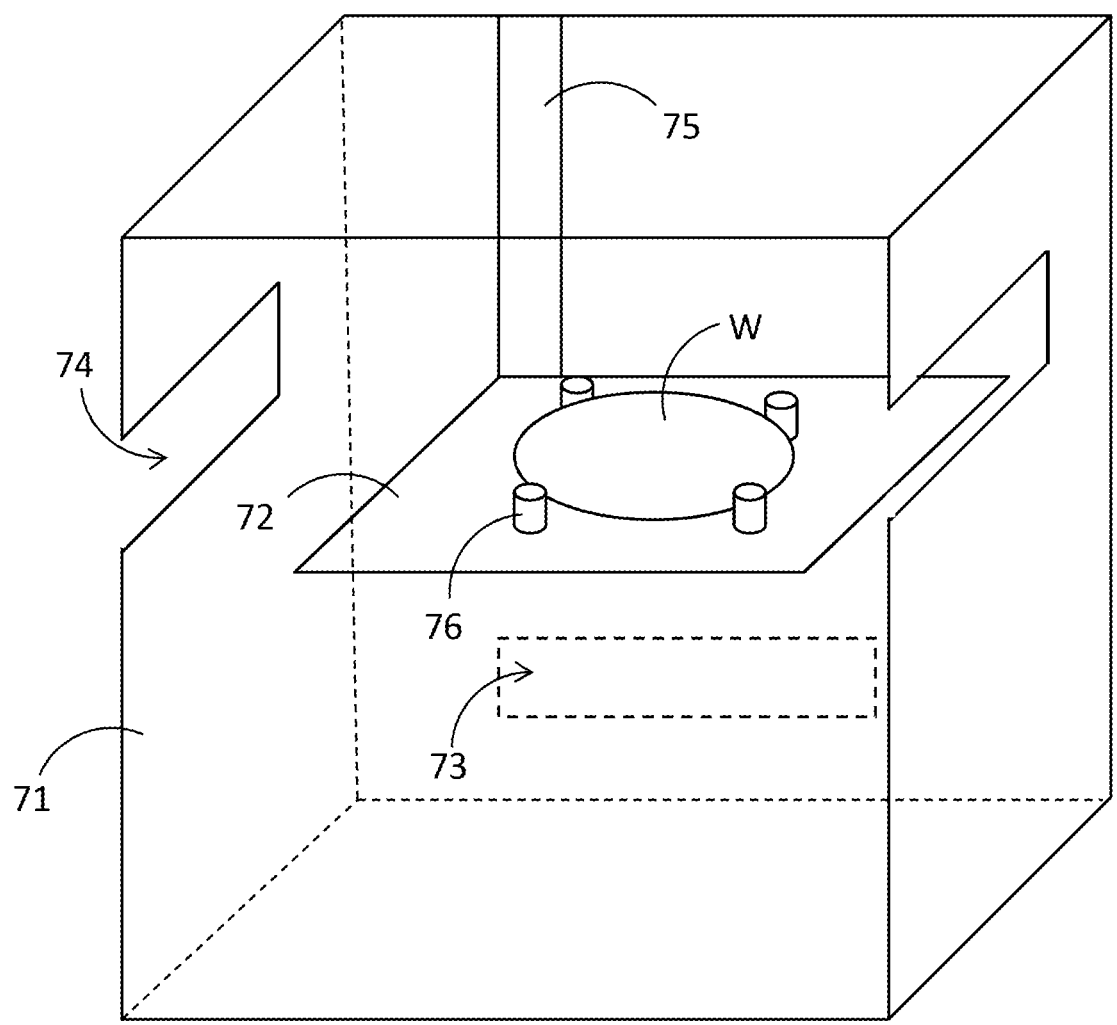
FIG. 3 is an exploded perspective view illustrating an internal configuration of a first wafer station of the cleaning part illustrated in FIG. 1.

FIG. 3 is an exploded perspective view illustrating an internal configuration of the wafer station 33*a* of the first cleaning unit 30*a*. As illustrated in FIG. 3, the wafer station 33*a* has a casing 71 having a substantially rectangular parallelepiped shape, a stage 72 disposed inside the casing 71 and configured to hold a wafer W, and a drive mechanism 75 configured to vertically move the stage 72.

Among these, the casing 71 has a bottom plate, four side plates, and a top plate. As illustrated in FIG. 3, a lower end section of the side plate facing the polishing part 12, among the four side plates, is formed with a carry-in port 73 that is communicated with the polishing part 12. The carry-in port 73 can be opened and closed by a shutter, which is not shown. The transport robot 23 of the polishing part 12 can have access to the inside of the casing 71 from the carry-in port 73.

Additionally, as illustrated in FIG. 3, there is formed an arm-passage opening 74 for passing arms of the cleaning-part transport mechanism 32*a* at a height position, which is higher than the carry-in port 73, of the other three side plates (i.e. a side plate facing the first cleaning-part transport mechanism 32*a*, which is described later, and side plates on left and right) among the four side plates. The wafer-transport opening 74 can be opened and closed by a shutter, which is not shown. As illustrated in FIG. 3, the cleaning-part transport mechanism 32*a* of the first cleaning unit 30*a* can have access to the inside of the casing 71 from the arm-passage opening 74.

As the drive mechanism 75, for example, a motor drive mechanism using a ball screw, or an air cylinder is used. The stage 72 is fixed to a movable part of the drive mechanism 75, and moved vertically between a height positions facing the carry-in port 73 and facing the wafer-transport opening 74, by power applied from the drive mechanism 75.

On an outer periphery of the stage 72, four pins 76 projecting upward are provided. Thus, the wafer W that is placed on the stage 72 is supported on the stage 72 with its outer peripheral edge guided and positioned by the four pins 76. These pins 76 are formed of a resin such as a polypropylene (PP), a polychlorotrifluoroethylene (PCTFE), or a polyetheretherketone (PEEK).

Since the second cleaning unit 30*b* has a similar configuration as the first cleaning unit 30*a*, description is omitted.

Since the cleaning modules 311*b* to 314*b* of the second cleaning unit 30*b* have similar configurations as the cleaning modules 311*a* to 314*a* of the first cleaning unit 30*a*, the cleaning modules 311*a* to 314*a* of the first cleaning unit 30*a* are described below.

As illustrated in FIG. 2, the four cleaning modules 311*a* to 314*a* (hereinafter also referred to as primary to quaternary cleaning modules) are arranged in series in this order from the wafer station 33*a*. Each of the cleaning modules 311*a* to 314*a* has a cleaner, which is not shown, and a casing 91 (see FIGS. 5A to 5E) configured to cover the cleaner.

As the cleaner of the primary cleaning module 311*a* and the secondary cleaning module 312*a*, for example, there can be used a roll-type cleaner that cleans front and back surfaces of a wafer by rotating roll type sponges vertically arranged, and pressing the sponges to the front and back surfaces of the wafer. As the cleaner of the tertiary cleaning module 313*a*, for example, there can be used a pencil-type cleaner that cleans by pressing a hemispherical sponge to a wafer while rotating the sponge. As the cleaner of the quaternary cleaning module 314a, for example, there can be used a pencil-type cleaner that can perform rinse cleaning of the back surface of a wafer, and cleans the front surface of the wafer by pressing a hemispherical sponge while rotating the sponge. This cleaner of the quaternary cleaning module 314a is provided with a stage configured to rotate a chucked wafer at a high speed, and has a function of drying a cleaned wafer by rotating the wafer at a high speed (spin-drying function). It should be noted that, in addition to the roll-type cleaner or the pencil-type cleaner described above, the cleaner of each of the cleaning modules 311a to 314a may be additionally provided with a megasonic-type cleaner that cleans by applying supersonic to cleaning liquid.

Since the cleaning-part transport mechanism 32b of the second cleaning unit 30b has a similar configuration as the cleaning-part transport mechanism 32a of the first cleaning unit 30a, the cleaning-part transport mechanism 32a of the first cleaning unit 30a is described below.

FIG. 4 is a perspective view illustrating the cleaning-part transport mechanism 32a of the first cleaning unit 30a. As illustrated in FIG. 4, the cleaning-part transport mechanism 32a has a first wafer-holding mechanism 601 and a second wafer-holding mechanism 602, each of which is configured to hold a wafer W, and an arm-transport mechanism 62 configured to move the first wafer-holding mechanism 601 and the second wafer-holding mechanism 602 linearly along an arrangement direction of the plurality of cleaning modules 311a to 314a. In this embodiment, namely, the number of the wafer-holding mechanisms 601 and 602 is less than the number of the cleaning modules 311a to 314a.

In this embodiment, for example, the first wafer-holding mechanism 601 and the second wafer-holding mechanism 602 can be properly used according to cleanliness of the wafer W. For example, among the primary to quaternary cleaning modules 311a to 314a, while the first wafer-holding mechanism 601 is used at the primary cleaning module 311a and the secondary cleaning module 312a of a first half of the cleaning process, the second wafer-holding mechanism 602 is used at the tertiary cleaning module 313a and the quaternary cleaning module 314a of a second half of the cleaning process, which can prevent contamination of the wafer W at the second half of the cleaning process due to contact with the first wafer-holding mechanism 601.

More specifically, the first wafer-holding mechanism 601 has a pair of openable/closable first arms 611 configured to hold a wafer, a first vertical-moving mechanism 641 configured to vertically move the pair of first arms 611, a first rotating mechanism 631 configured to rotate the pair of first arms 611 around a rotating shaft 631A that is in parallel with an opening/closing direction, and a first opening/closing mechanism 661 configured to open and close the pair of first arms 611 in a direction mutually approaching or a direction mutually separating.

Similarly, the second wafer-holding mechanism 602 has a pair of openable/closable second arms 612 configured to hold a wafer, a second vertical-moving mechanism 642 configured to vertically move the pair of second arms 612, a second rotating mechanism 632 configured to rotate the pair of second arms 612 around a rotating shaft 632A that is in parallel with an opening/closing direction, and a second opening/closing mechanism 662 configured to open and close the pair of second arms 612 in a direction mutually approaching or a direction mutually separating.

As the hand-transport mechanism 62, for example, a motor drive mechanism using a ball screw is used. The ball screw of the hand-transport mechanism 62 is provided to extend above the cleaning modules 311a to 314a, in the arrangement direction of the cleaning modules 311a to 314a.

Next, an example of an operation of the pair of second arms 612 is described with reference to FIGS. 5A to 5E. As described above, each of the cleaning modules is partitioned by the casing 91 so as to prevent an external splash of fluid to be used during cleaning of the wafer W, and an arm-passage opening 94 is formed on a side surface of the casing 91. The arm-passage opening 94 is provided with a shutter 97 that can be opened and closed.

Figure 5A:
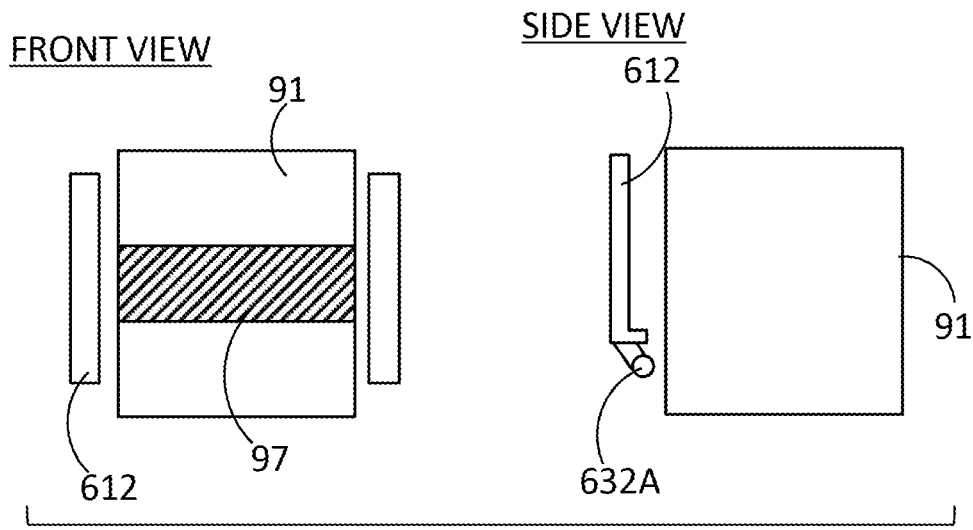
FIG. 5A is an exemplary view for explaining an operation of a second wafer-holding mechanism of the cleaning-part transport mechanism illustrated in FIG. 4.

When the cleaned wafer W is taken out from the casing 91, as illustrated in FIG. 5A, the pair of second arms 612 with their tips directed upward are moved to a standby position adjacent to the casing 91 by driving the arm-transport mechanism 62. In this embodiment, even when the shutter 97 of the casing 91 is closed, the pair of second arms 612 can be moved to the standby position adjacent to the casing 91 by directing the tips of the pair of second arms 612 upward. This can provide a quicker start timing of wafer-taking-out operation, and an improved throughput of entire process.

Figure 5B:
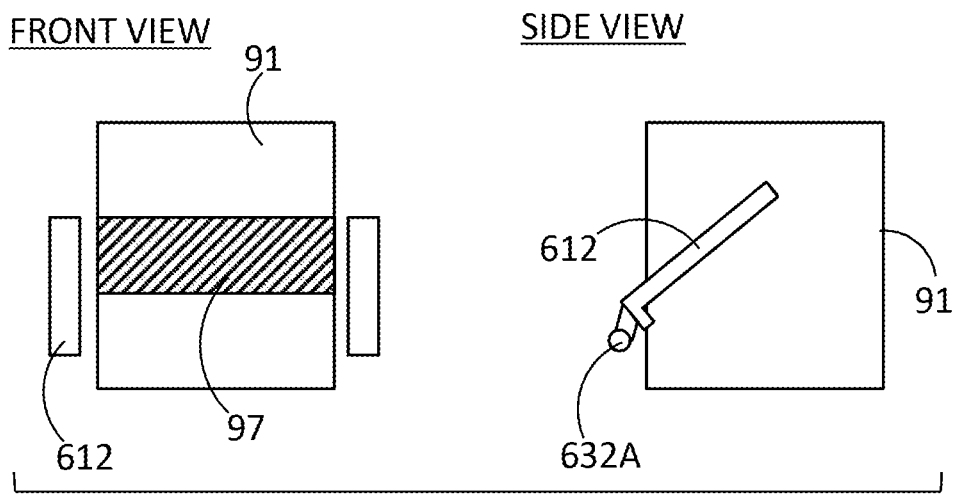
FIG. 5B is an exemplary view for explaining an operation of the second wafer-holding mechanism of the cleaning-part transport mechanism illustrated in FIG. 4.

Next, as illustrated in FIGS. 5B and 5C, by driving the second rotating mechanism 632, the pair of second arms 612 are rotated around the rotating shaft 632A. In the illustrated example, the pair of second arms 612 are rotated clockwise by 90 degrees around the rotating shaft 632A in a side view, and the tips of the pair of second arms 612 are directed laterally.

Next, as illustrated in FIG. 5D, by driving the second vertical-moving mechanism 642, the pair of second arms 612 are lifted to a height position same as that of the arm-passage opening 94. At this time, the shutter 97 is retracted to open the arm-passage opening 94.

Next, as illustrated in FIG. 5E, by driving the second opening/closing mechanism 662, the pair of second arms 612 are closed in the mutually approaching direction, and inserted into the casing 91 through the arm-passage opening 94 to hold the wafer W in the casing 91. Then, by driving the arm-transport mechanism 62, the pair of second arms 612 holding the wafer W are moved to the next cleaning module.

When a wafer W before cleaning is carried into the casing 91, the above-described operations illustrated in FIGS. 5A to 5E are performed in reverse order. Namely, as illustrated in FIG. 5E, by driving the arm-transport mechanism 62, the pair of second arms 612 holding the wafer W are moved into the casing 91 through the arm-passage opening 94.

Next, as illustrated in FIG. 5D by driving the second opening/closing mechanism 662, the pair of second arms 612 are opened in the mutually separating direction, and taken out of the casing 91 through the arm-passage opening 94.

Next, as illustrated in FIG. 5C, by driving the second vertical-moving mechanism 642, the pair of second arms 612 are lowered to a height position that is lower than that of the arm-passage opening 94. At this time, the shutter 97 closes the arm-passage opening 94, and a cleaning process of the wafer W is started inside the casing 91.

Next, as illustrated in FIGS. 5A and 5B, by driving the second rotating mechanism 632, the pair of second arms 612 are rotated around the rotating shaft 632A. In the illustrated example, the pair of second arms 612 are rotated counter-clockwise by 90 degrees around the rotating shaft 632A in a side view, and the tips of the pair of second arms 612 are directed upward. Then, by driving the arm-transport mechanism 62, the pair of second arms 612 with their tips directed upward are moved to the next cleaning module. In this embodiment, it is possible to reduce a space required above the pair of second arms 612 since the second vertical-moving mechanism 642 lowers the pair of second arms 612 when the second rotating mechanism 632 rotates the pair of second arms 612 so as to direct their tips upward.

Next, an example of a cleaning process of a wafer W using a cleaning part 13 with such a configuration is described. In this embodiment, wafers W transported from the polishing part 12 to the cleaning part 13 are distributed to the first cleaning unit 30a and the second cleaning unit 30b by the transport robot 23, and cleaned in parallel at the first cleaning unit 30a and the second cleaning unit 30b. Accordingly, a throughput of entire process can be improved.

Since a wafer cleaning process at the second cleaning unit 30b is similar to a wafer cleaning process at the first cleaning unit 30a, the wafer cleaning process at the first cleaning unit 30a is described below.

Figure 6A:
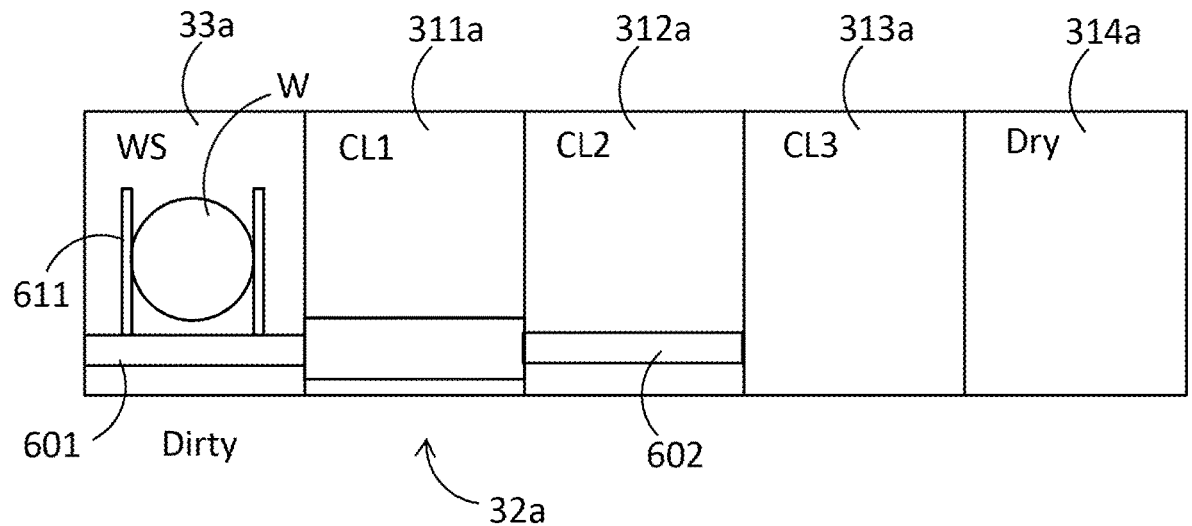
FIG. 6A is an exemplary view for explaining an operation of the first cleaning unit.

As illustrated in FIG. 6A, firstly, with each of tips of the pair of first arms 611 and of the pair of second arms 612 directed upward, the first wafer-holding mechanism 601 and the second wafer-holding mechanism 602 are moved along the arrangement direction of first cleaning modules 311a to 314a by driving the hand-transport mechanism 62, and the pair of first arms 611 are stopped at a standby position adjacent to the first wafer station 33a. Then, by driving the first rotating mechanism 631, the pair of first arms 611 are rotated around the rotating shaft 631A, and the tips of the pair of first arms 611 are directed laterally. After a shutter of the first wafer station 33a is retracted to open the arm-passage opening 74, the pair of first arms 611 are inserted into the first wafer station 33a through the arm-passage opening 74, to hold a wafer W kept on the stage 72. After the pair of first arms 611 hold the wafer W, the stage 72 is retracted downward.

Figure 6B:
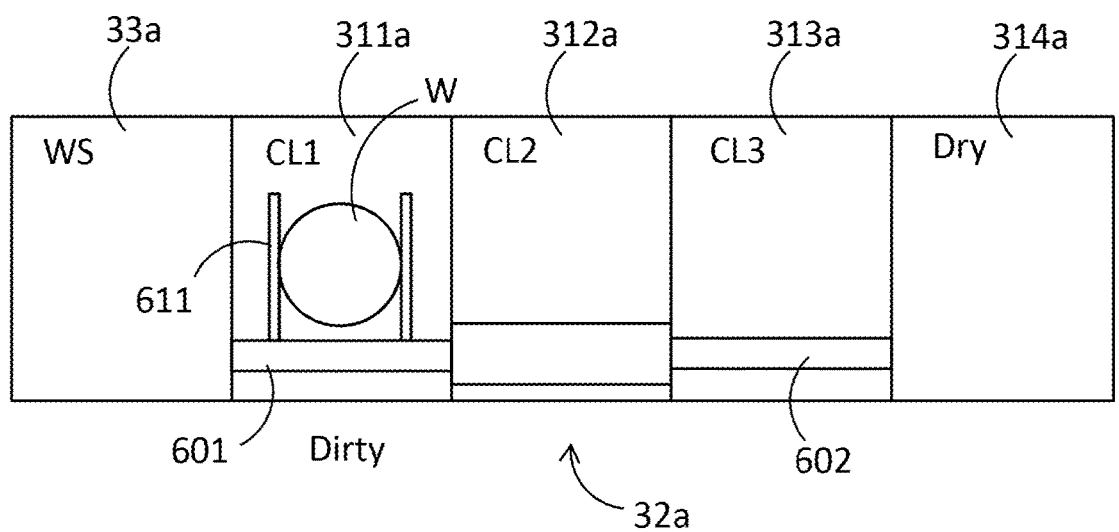
FIG. 6B is an exemplary view for explaining an operation of the first cleaning unit.

Next, as illustrated in FIG. 6B, after the shutter 97 of the primary cleaning module 331a is retracted to open the arm-passage opening 94, the first wafer-holding mechanism 601 and the second wafer-holding mechanism 602 are moved along the arrangement direction of the cleaning modules 311a to 314a by driving the hand-transport mechanism 62, and the wafer W held by the pair of first arms 611 is transported from the first wafer station 33a to the primary cleaning module 331a, and transferred to the cleaner of the primary cleaning module 331a. Then, after the pair of first arms 611 are taken out of the casing 91 of the primary cleaning module 331a, the shutter 97 closes the arm-passage opening 94, and the cleaner of the primary cleaning module 331a cleans the wafer W.

After the cleaning process at the primary cleaning module 331a is finished, the shutter 97 is retracted to open the arm-passage opening 94. The pair of first arms 611 are inserted into the casing 91 of the primary cleaning module 331a through the arm-passage opening 94, to hold the wafer W cleaned by the cleaner.

Figure 6C:
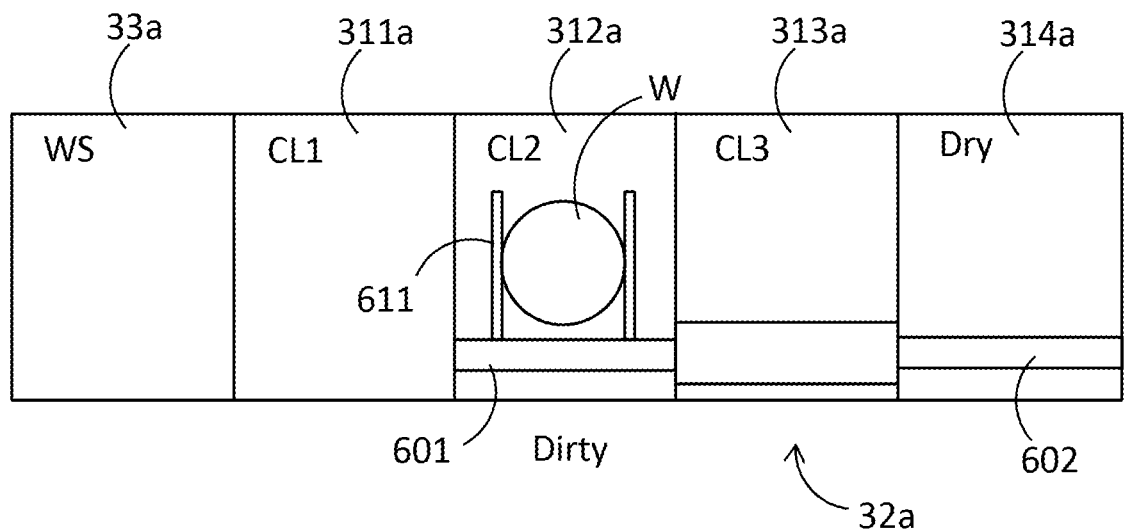
FIG. 6C is an exemplary view for explaining an operation of the first cleaning unit.

Next, as illustrated in FIG. 6C, after the shutter 97 of the secondary cleaning module 332a is retracted to open the arm-passage opening 94, the first wafer-holding mechanism 601 and the second wafer-holding mechanism 602 are moved along the arrangement direction of the cleaning modules 311a to 314a by driving the hand-transport mechanism 62, and the wafer W held by the pair of first arms 611 is transported from the primary cleaning module 331a to the secondary cleaning module 332a, and transferred to the cleaner of the secondary cleaning module 332a. Then, after the pair of first arms 611 are taken out of the casing 91 of the secondary cleaning module 332a, the shutter 97 closes the arm-passage opening 94, and the cleaner of the secondary cleaning module 332a cleans the wafer W.

Figure 6D:
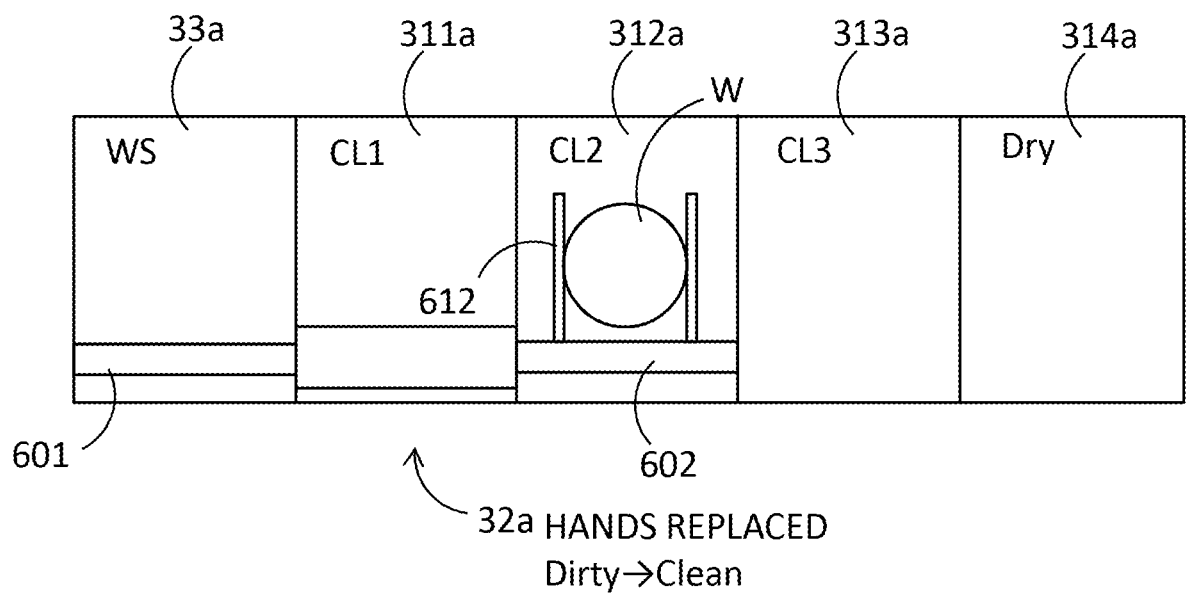
FIG. 6D is an exemplary view for explaining an operation of the first cleaning unit.

Then, as illustrated in FIG. 6D, by driving the first rotating mechanism 631, the pair of first arms 611 are rotated around the rotating shaft 631A, and the tips of the pair of first arms 611 are directed upward. Then, with each of the tips of the pair of first arms 611 and of second arms 612 directed upward, the first wafer-holding mechanism 601 and the second wafer-holding mechanism 602 are moved along the arrangement direction of first cleaning modules 311a to 314a by driving the hand-transport mechanism 62, and the pair of second arms 612 are stopped at a standby position adjacent to a secondary cleaning module 332a. By driving the second rotating mechanism 632, the pair of second arms 612 are rotated around the rotating shaft 632A, and the tips of the pair of second arms 612 are directed laterally.

After the cleaning process at the secondary cleaning module 332a is finished, the shutter 97 is retracted to open the arm-passage opening 94. The pair of second arms 612 are inserted into the casing 91 of the secondary cleaning module 332a through the arm-passage opening 94, to hold the wafer W cleaned by the cleaner.

Thus, in this embodiment, while the pair of first arms 611 hold and transport the wafer W before cleaning at the secondary cleaning module 332a, the pair of second arms 612 hold and transport the cleaned wafer W at the secondary cleaning module 332a. In other words, arms are replaced at the secondary cleaning module 332a. This can prevent contamination of the cleaned wafer W at the secondary cleaning module 332a due to contact of the wafer W with the pair of first arms 611.

Figure 6E:
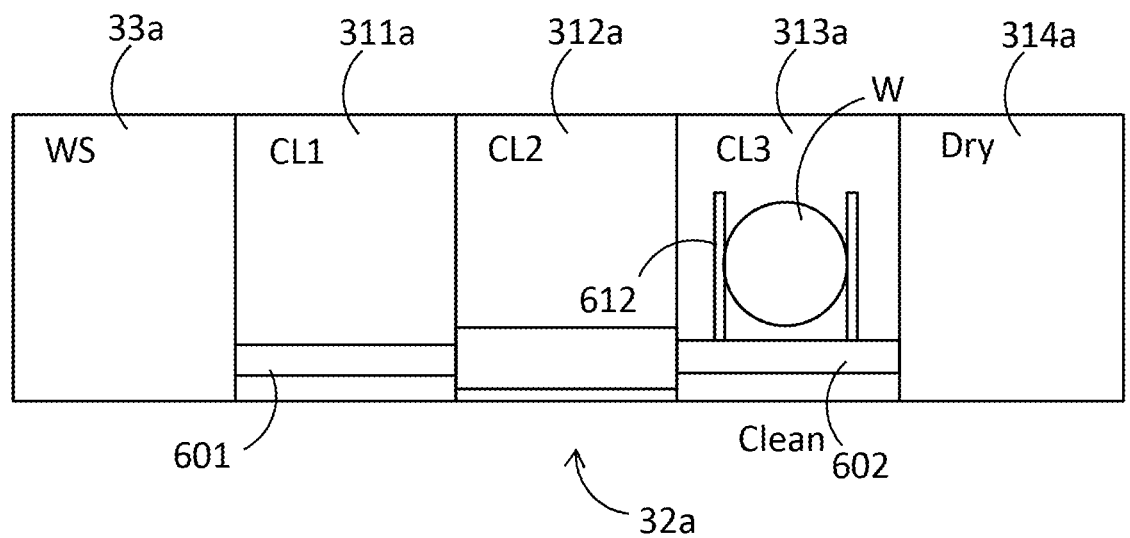
FIG. 6E is an exemplary view for explaining an operation of the first cleaning unit.

Next, as illustrated in FIG. 6E, after the shutter 97 of the tertiary cleaning module 333a is retracted to open the arm-passage opening 94, the first wafer-holding mechanism 601 and the second wafer-holding mechanism 602 are moved along the arrangement direction of the cleaning modules 311a to 314a by driving the hand-transport mechanism 62, and the wafer W held by the pair of second arms 612 is transported from the secondary cleaning module 332a to the tertiary cleaning module 333a, and transferred to the cleaner of the tertiary cleaning module 333a. Then, after the pair of second arms 612 are taken out of the casing 91 of the tertiary cleaning module 333a, the shutter 97 closes the arm-passage opening 94, and the cleaner of the tertiary cleaning module 333a cleans the wafer W.

After the cleaning process at the tertiary cleaning module 333a is finished, the shutter 97 is retracted to open the arm-passage opening 94. The pair of second arms 612 are inserted into the casing 91 of the tertiary cleaning module 333a through the arm-passage opening 94, to hold the wafer W cleaned by the cleaner.

Figure 6F:
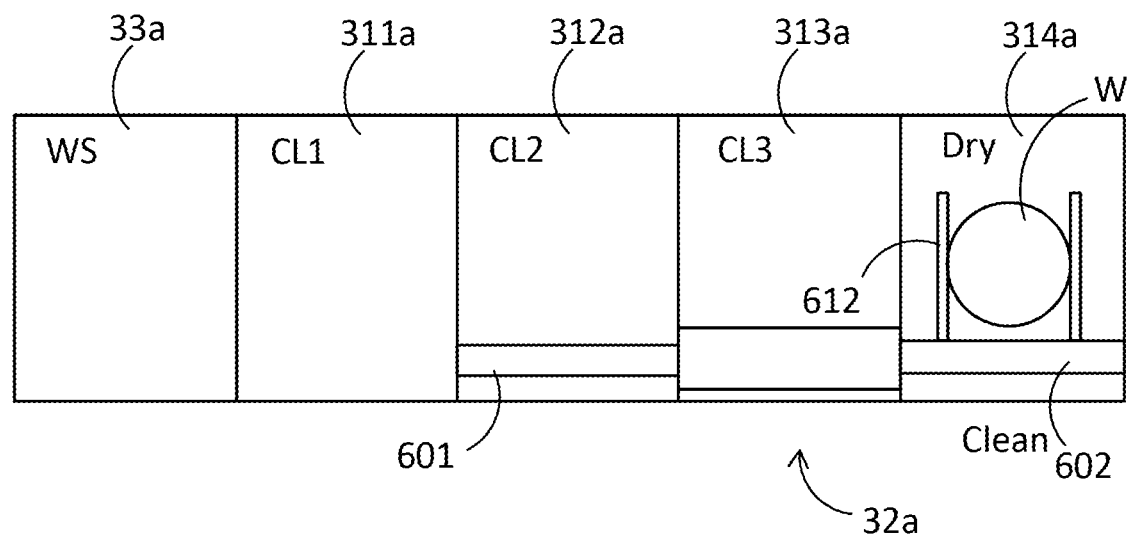
FIG. 6F is an exemplary view for explaining an operation of the first cleaning unit.

Next, as illustrated in FIG. 6F, after the shutter 97 of the quaternary cleaning module 334a is retracted to open the arm-passage opening 94, the first wafer-holding mechanism 601 and the second wafer-holding mechanism 602 are moved along the arrangement direction of the cleaning modules 311a to 314a by driving the hand-transport mechanism 62, and the wafer W held by the pair of second arms 612 is transported from the tertiary cleaning module 333a to the quaternary cleaning module 334a, and transferred to the cleaner of the quaternary cleaning module 334a. Then, after the pair of second arms 612 are taken out of the casing 91 of the quaternary cleaning module 334a, the shutter 97 closes the arm-passage opening 94, and the cleaner of the quaternary cleaning module 334a cleans the wafer W.

After the cleaning process at the quaternary cleaning module 334a is finished, the shutter 97 is retracted to open the arm-passage opening 94. A hand of the transport robot 111 of the loading/unloading part 11 described above is inserted into the casing 91 of the quaternary cleaning module 334a through the arm-passage opening 94, to take out the wafer W cleaned by the cleaner to the loading/unloading part 11.

<Teaching Apparatus>

Next, a teaching apparatus for performing teaching work at a first cleaning unit 30a and a second cleaning unit 30b of a cleaning part. 13 with such a configuration is described. It should be noted that, since the teaching apparatus for performing teaching work at the second cleaning unit 30b has a similar configuration as the teaching apparatus for performing teaching work at the first cleaning unit 30a, the teaching apparatus for performing the teaching work at the first cleaning unit 30a is described below.

Figure 7:
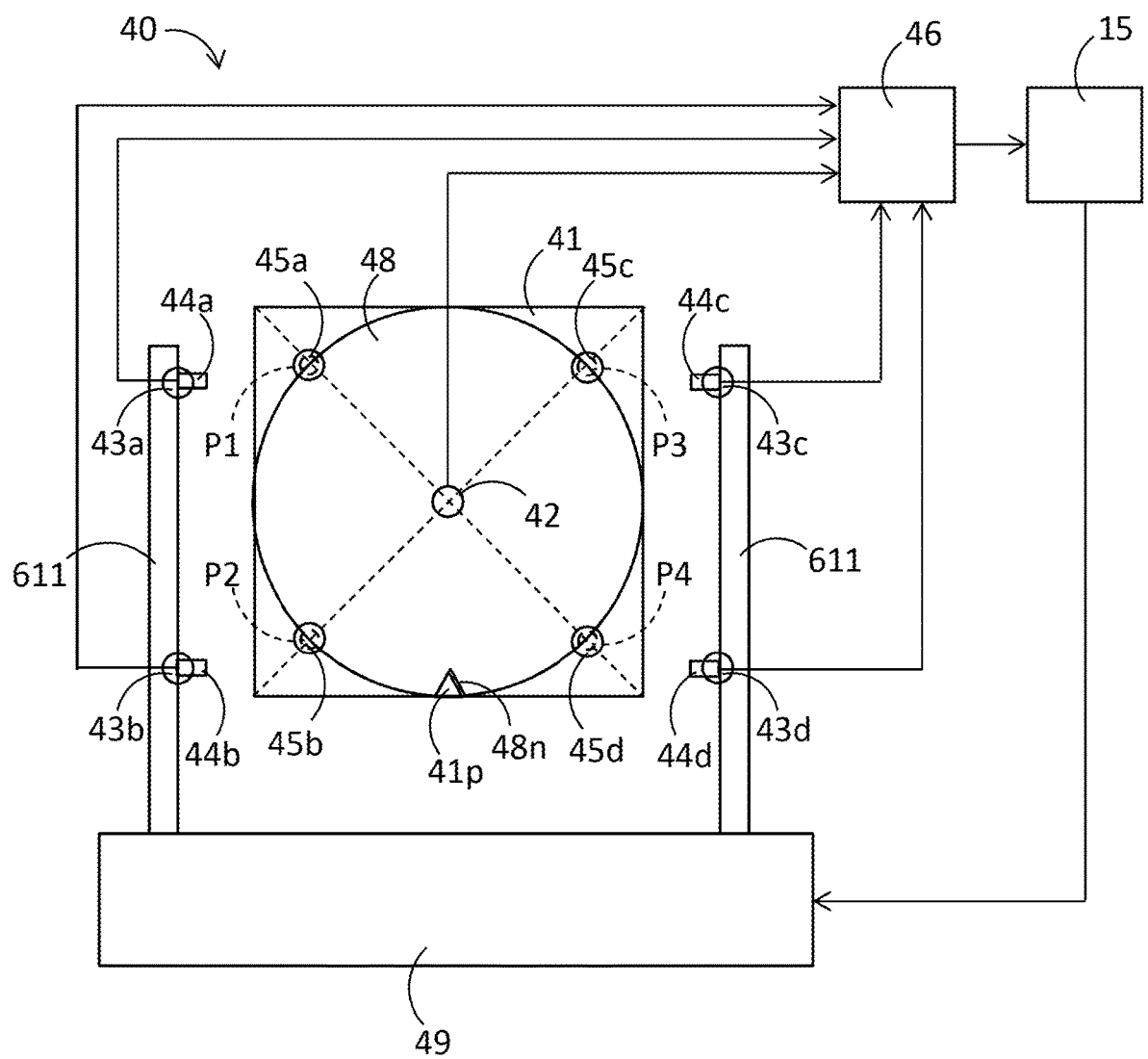
FIG. 7 is a plan view illustrating a teaching apparatus.

FIG. 7 is a plan view illustrating a teaching apparatus 40 according to the embodiment. As illustrated in FIG. 7, the teaching apparatus 40 has a stage 41 on which a wafer W is placed, a pair of openable/closable arms 611 configured to hold the wafer w, an arm-moving mechanism 49 configured to move the pair of arms 611 with respect to the stage 41, and a control part 15 configured to control an operation of the arm-moving mechanism 49.

Among these, the stage 41 is installed in a casing 91 of each of cleaning modules 331a to 334a of the first cleaning unit 30a described above. While an upper surface of the stage 41 is provided with a projection 41p, a notch formed on a peripheral edge of the wafer W is engaged with the projection 41p, so that the wafer W placed on the stage 41 is uniquely positioned at a predetermined cleaning position.

In a cleaning-part transport mechanism 32a described above, the arm-moving mechanism 49 is structured of an arm-transport mechanism 62 configured to move the pair of arms 611 in the longitudinal direction (also referred to as an X-direction), a depth-directional moving mechanism 67 configured to move the pair of arms 611 in a depth direction (also referred to as a Y-direction), a vertical-moving mechanism 641 configured to move the pair of arms 611 in a vertical direction (also referred to as a Z-direction), and an opening/closing mechanism 661 configured to open and close the pair of arms 611. Therefore, the arm-moving mechanism 49 can move the pair of arms 611 in each of the X-, Y-, and Z-directions, and can open and close the pair of arms 611.

The teaching apparatus 40 further has four arm-side position sensors 43a to 43d attached to the pair of arms 611 and configured to transmit position signal, a dummy wafer 48 placed on the stage 41, a dummy-wafer-side position sensor 42 attached to the dummy wafer 48 and configured to transmit a position signal, and a signal receiver 46 configured to receive the position signal from each of the arm-side position sensors 43a to 43d to determine a position coordinate of each of the arm-side position sensors 43a to 43d, and receive the position signal from the dummy-wafer-side position sensor 42 to determine a position coordinate of the dummy-wafer-side position sensor 42.

The dummy wafer 48 has a same shape as that of the wafer W. A notch 48n is formed on a peripheral edge of the dummy wafer 48, and the notch on the peripheral edge is engaged with a projection 41p on an upper surface of the stage 41, so that the dummy wafer 48 placed on the stage 41 is uniquely positioned at a same position as the cleaning position of the wafer W.

In this embodiment, the arm-side position sensors 43a to 43d and the dummy-wafer-side position sensor 42 are three-dimensional position sensors. As the three-dimensional position sensor, for example, there is used a magnetic-type three-dimensional position sensor (also referred to as a three-dimensional magnetic sensor), which is publicly known.

In the illustrated example, the dummy-wafer-side position sensor 42 is attached to a center of the dummy wafer 48. Two arm-side position sensors 43a and 43b among the four arm-side position sensors 43a to 43d are attached on one arm 611 separately in the Y-direction, and the other two arm-side position sensors 43c and 43d are attached on the other arm 611 separately in the Y-direction.

Further, the teaching apparatus 40 is further provided with proximity sensors 44a to 44d and 45a to 45d attached to one or both of the dummy wafer 48 and the pair of arms 611, and configured to output a proximity amount of the pair of arms 611 with respect to the dummy wafer 48.

As the proximity sensors 44a to 44d and 45a to 45d, for example, optical proximity sensors are used. In the illustrated example, the four proximity sensors 44a to 44d attached to the pair of arms 611 are light-emitting portions, and the four proximity sensors 45a to 45d attached to the dummy wafer 48 are light-receiving portions. The four proximity sensors (light-receiving portions) 45a to 45d are attached at intervals of 90 degrees in a circumferential direction on a peripheral edge of a bottom surface of the dummy wafer 48. The two proximity sensors (light-emitting portions) 44a and 44b among the four proximity sensors (light-emitting portions) 43a to 43d are attached on one arm 611 separately in the Y-direction, and the other two proximity sensors 44c and 44d are attached on the other arm 611 separately in the Y-direction. The four proximity sensors (light-receiving portions) 45a to 45d output a received light amount as a "proximity amount".

The control part 15, based on the position coordinate of the dummy-wafer-side position sensor 42, calculates position coordinates P1 to P4 of respective arm-side position sensors 43a to 43d when the pair of arms 611 hold the wafer W on the stage 41. For example, when each of the arm-side position sensors 43a to 43d is attached to a same position as that of a chuck top of the pair of arms 611, control part 15 calculates position coordinates, as P1 to P4, of a point which is in contact with the chuck top on a peripheral edge of the wafer W when the pair of arms 611 hold the wafer W on the stage 41.

Then, the control part 15 controls the operation of the arm-moving mechanism 49 to move the pair of arms 611 such that the arm-side position sensors 43a to 43d respectively move to the calculated position coordinates P1 to P4. As a result, the pair of arms 611 can be automatically moved to the wafer W position on the stage 41, without complicated work that a person guides the pair of arms 611 to the wafer W position on the stage 41 while visually checking the position.

Additionally, the control part 15 stores a previously-determined received light amount (proximity amount) at the four proximity sensors (light-receiving portions) 45a to 45d when the pair of arms 611 hold the dummy wafer 48 on the stage 41.

Then, the control part 15, after moving the pair of arms 611 such that the arm-side position sensors 43a to 43d move to the calculated position coordinates P1 to P4, acquires proximity amounts outputted from the proximity sensors (light-receiving portions) 45a to 45d, and controls the operation of the arm-moving mechanism 49 to adjust the position of the pair of arms 611 such that this proximity amounts approach the predetermined value (previously stored value).

Figure 9A:
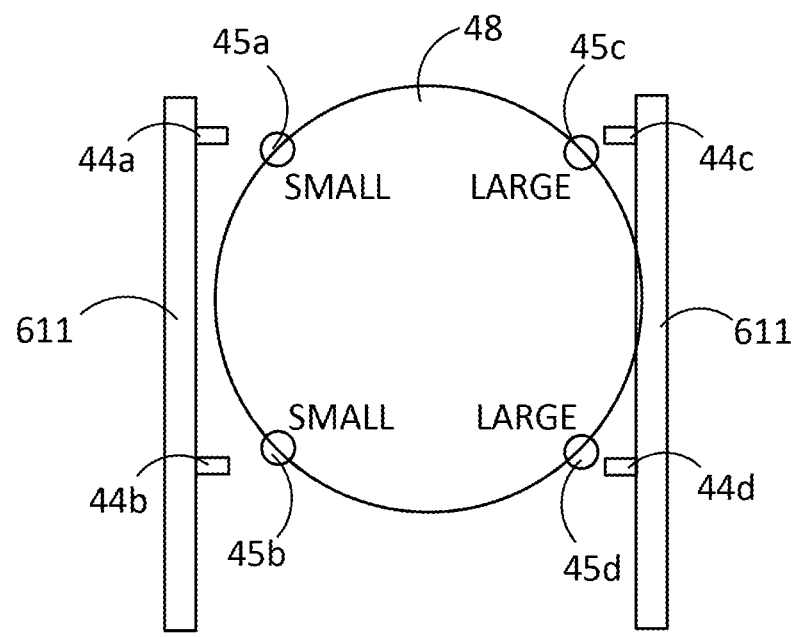
FIG. 9A is an exemplary view for explaining an example of an operation for adjusting an arm position based on a deviation amount.

For example, as illustrated in FIG. 9A, when the center of the pair of arms 611 is disposed while being displaced to the left side (minus X-direction) with respect to the center of the dummy wafer 48, the left-side proximity sensors (light-receiving portions) 45a and 45b are too far from the left-side proximity sensors (light-emitting portions) 44a and 44b, while the right-side proximity sensors (light-receiving portions) 45c and 45d are too close to the right-side proximity sensors (light-emitting portions) 44c and 44d. Therefore, the received light amount at each of the left-side proximity sensors (light-receiving portions) 45a and 45b is larger than the value previously stored in the control part 15, while the received light amount at each of the right-side proximity sensors (light-receiving portions) 45c and 45d is smaller than the value previously stored in the control part 15.

Figure 9B:
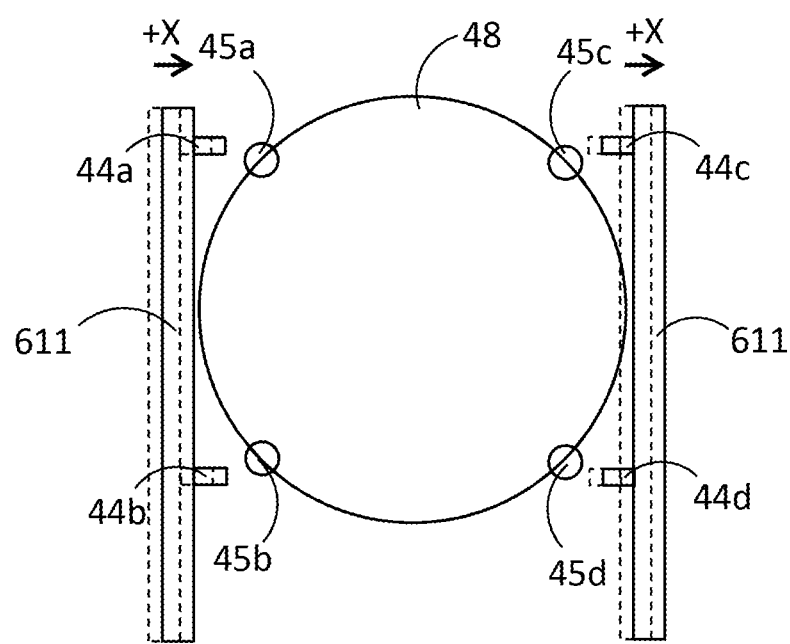
FIG. 9B is an exemplary view for explaining an example of an operation for adjusting an arm position based on a deviation amount.

In this case, as illustrated in FIG. 9B, the control part 15 controls the operation of the arm-moving mechanism 49 to adjust the center position of the pair of arms 611 to the right side (plus X-direction) such that the received light amount at each of the proximity sensors (light-receiving portions) 45a to 45d approaches the previously stored value.

Figure 10A:
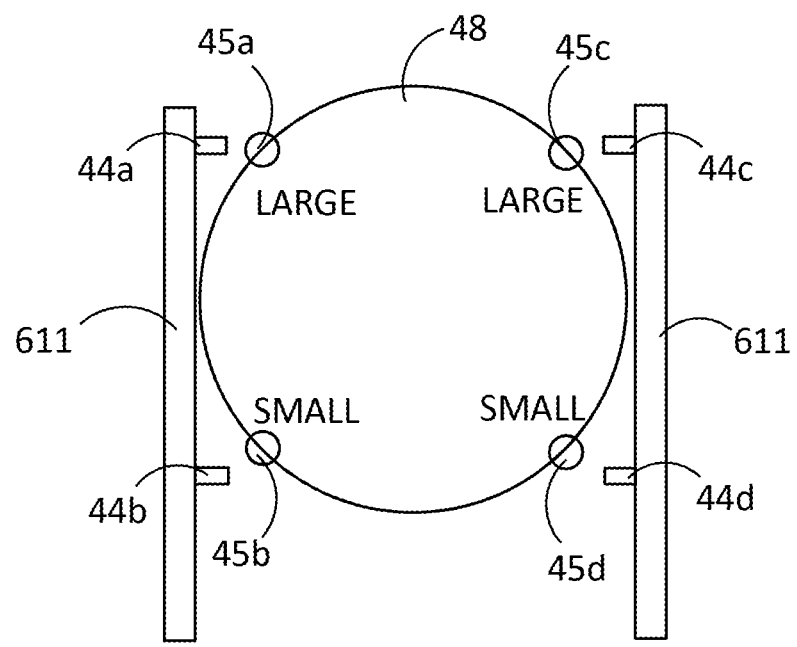
FIG. 10A is an exemplary view for explaining an example of an operation for adjusting an arm position based on a deviation amount.

As illustrated in FIG. 10A, when the center of the pair of arms 611 is disposed while being displaced to the front side (minus Y-direction) with respect to the center of the dummy wafer 48, the front-side proximity sensors (light-receiving portions) 45b and 45d are too far from the front-side proximity sensors (light-emitting portions) 44b and 44d, while the back-side proximity sensors (light-receiving portions) 45a and 45c are too close to the back-side proximity sensors (light-emitting portions) 44a and 44c. Therefore, the received light amount at each of the front-side proximity sensors (light-receiving portions) 45b and 45d is larger than the value previously stored in the control part 15, while the received light amount at each of the back-side proximity sensors (light-receiving portions) 45a and 45c is smaller than the value previously stored in the control part 15.

Figure 10B:
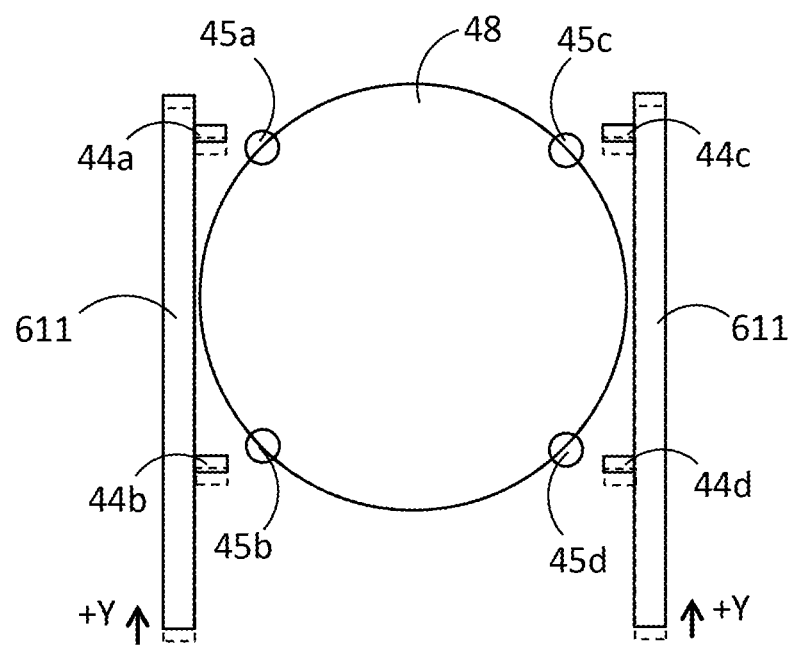
FIG. 10B is an exemplary view for explaining an example of an operation for adjusting an arm position based on a deviation amount.

In this case, as illustrated in FIG. 10B, the control part 15 controls the operation of the arm-moving mechanism 49 to adjust the center position of the pair of arms 611 to the back side (plus Y-direction) such that the received light amount at each of the proximity sensors (light-receiving portions) 45a to 45d approaches the previously stored value.

Figure 11A:
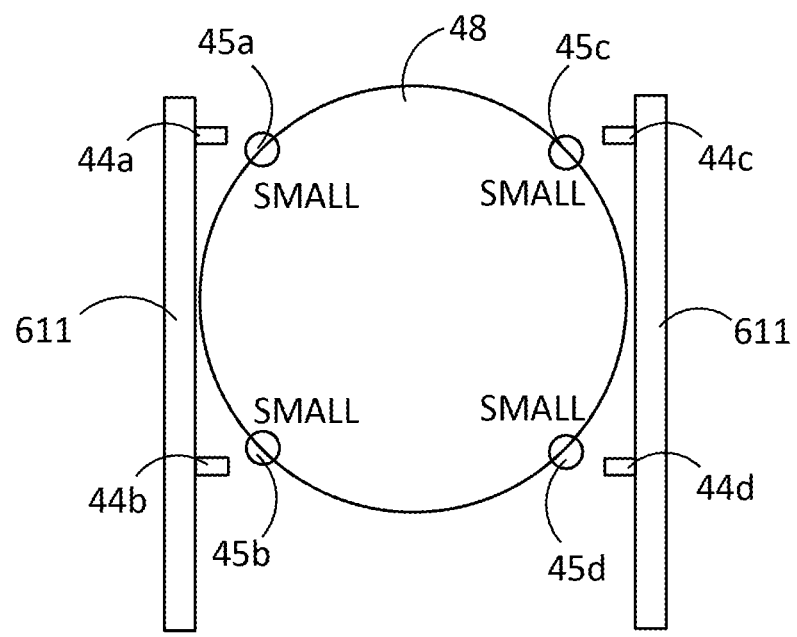
FIG. 11A is an exemplary view for explaining an example of an operation for adjusting an arm position based on a deviation amount.

Further, as illustrated in FIG. 11A, when a center of the pair of arms 611 is disposed while being displaced downward (minus Z-direction) with respect to the center of the dummy wafer 48, all the proximity sensors (light-receiving portions) 45a to 45d are too far from all the proximity sensors (light-emitting portions) 44a to 44d. Therefore, the received light amount at each of all the proximity sensors (light-receiving portions) 45a to 45d are smaller than the value previously stored in the control part 15.

Figure 11B:
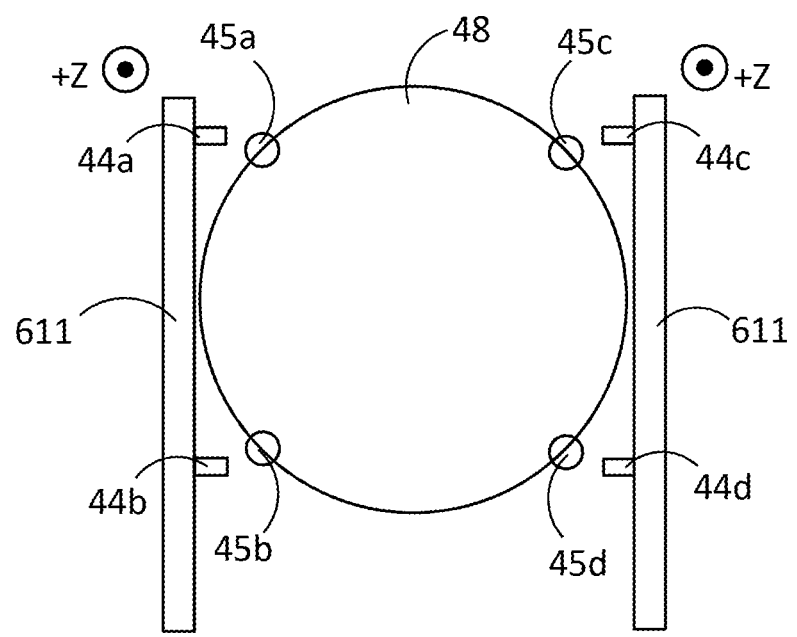
FIG. 11B is an exemplary view for explaining an example of an operation for adjusting an arm position based on a deviation amount.

In this case, as illustrated in FIG. 11B, the control part 15 controls the operation of the arm-moving mechanism 49 to adjust the center position of the pair of arms 611 to upward (plus Z-direction) such that the received light amount at each of the proximity sensors (light-receiving portions) 45a to 45d approaches the previously stored value.

Thus, by adjusting the position of the pair of arms 611 based on the proximity amounts (received light amounts) outputted from the proximity sensors 44a to 44d and 45a to 45d, the teaching work can be performed with finer accuracy than measurement accuracy of the position sensors 42 and 43a to 43d.

Furthermore, the control part 15 is configured to evaluate an assembled state of the pair of arms 611, by comparing the position coordinates from the arm-side position sensors 43a to 43d with each other. For example, if Y-coordinates of the two left-side arm-side position sensors 43a and 43b are different from each other, the control part 15 determines that the left-side arm 611 is mounted while being bent diagonally with respect to the Y-direction, and emits sound, light, or the like, to call attention of a worker.

Figure 8:
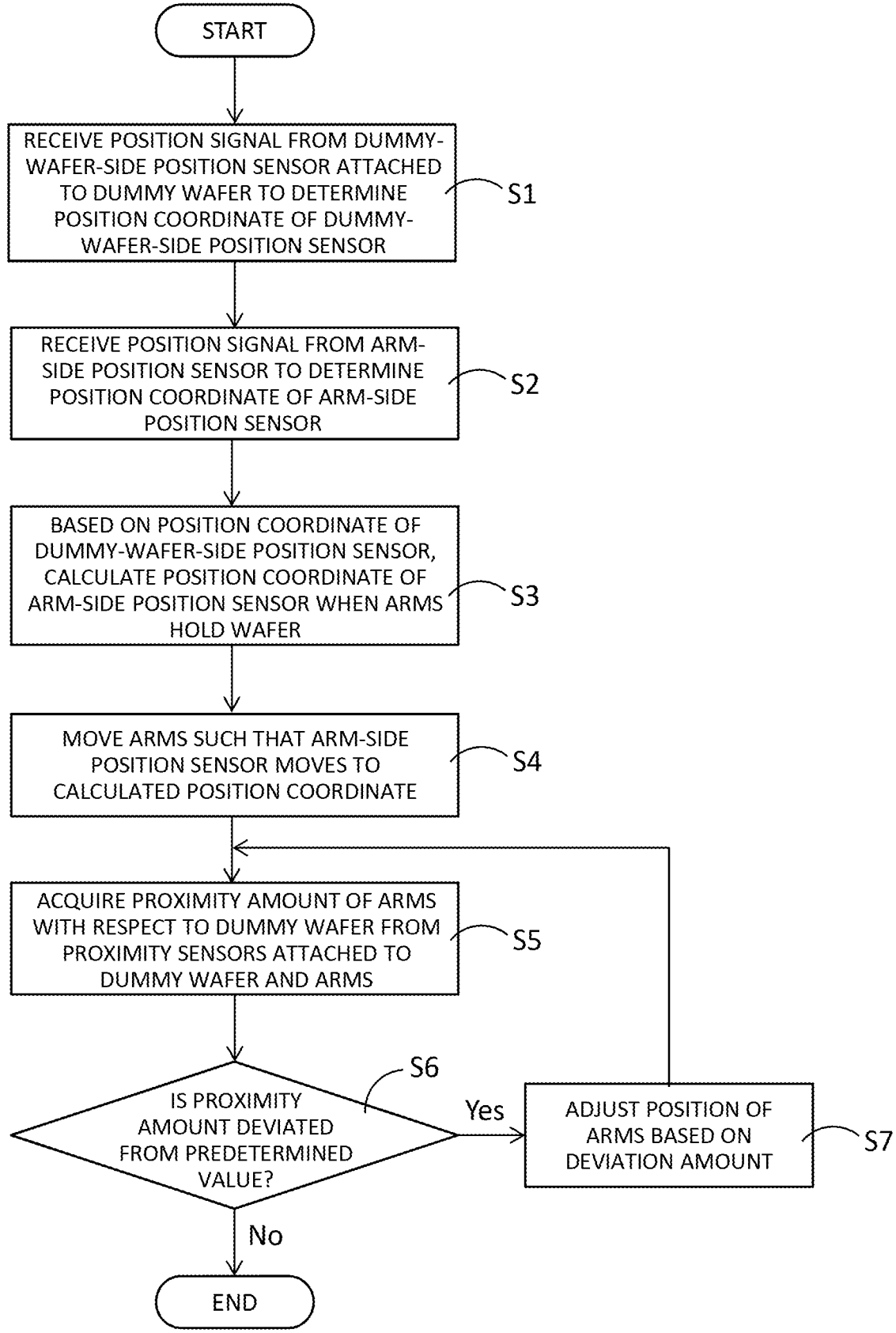
FIG. 8 is a flow chart illustrating an operation of the teaching apparatus illustrated in FIG. 7.

Next, with reference to FIG. 8, an operation of the teaching apparatus 40 with such a configuration is described.

Firstly, as a preparation step, a worker manually places the dummy wafer 48, which is attached with the dummy-wafer-side position sensor 42, on the stage 41. Then, the worker presses down an automatic-teaching start button provided on the control part 15.

At this time, the signal receiver 46 receives a position signal from the dummy-wafer-side position sensor 42 that is attached to the dummy wafer 48 placed on the stage 41, to determine a position coordinate of the dummy-wafer-side position sensor 42 (step S1).

The signal receiver 46 also receives a position signal from each of the arm-side position sensors 43a to 43d attached to the pair of arms 611, to determine a position coordinate of each of the arm-side position sensors 43a to 43d (step S2).

Next, the control part 15 acquires the position coordinate of the dummy-wafer-side position sensor 42 from the signal receiver 46, and based on this position coordinate, calculates position coordinates P1 to P4 of the respective arm-side position sensors 43a to 43d when the pair of arms 611 hold the wafer W (step S3).

Then, the control part 15 controls the operation of the arm-moving mechanism 49 to move the pair of arms 611 such that the arm-side position sensors 43a to 43d respectively move to the calculated position coordinates P1 to P4 (step S4).

Next, the control part 15 acquires a proximity amount of the pair of arms 611, which is from the proximity sensor 44a to 44d and 45a to 45d attached to the arms 611 and the dummy wafer 48, with respect to the dummy wafer 48 (step S5).

Then, the control part 15 determines whether the acquired proximity amount is deviated from the predetermined value (previously stored value) (step S6). When the step S6 determines that there is no deviation, the operation of the teaching apparatus 40 is finished. On the other hand, when the step S6 determines that there is deviation, the control part 15, based on a deviation amount, controls the operation of the arm-moving mechanism 49 to adjust the position of the pair of arms 611 (step S7). After that, the processing returns the step S5 to repeat.

In this way, according to the teaching apparatus 40 of the embodiment, the signal receiver 46 receives position signals from the arm-side position sensors 43a to 43d to determine position coordinates of the arm-side position sensors 43a to 43d, and receives a position signal from the dummy-wafer-side position sensor 42 to determine a position coordinate of the dummy-wafer-side position sensor 42. Then, the control part 15, based on the position coordinate of the dummy-wafer-side position sensor 42, calculates position coordinates of the arm-side position sensors 43a to 43d when the pair of arms 611 hold the wafer W, and controls the operation of the arm-moving mechanism 49 to move the pair of arms 611 such that the arm-side position sensors 43a to 43d move to the calculated position coordinates. As a result, the pair of arms 611 can be automatically moved to the wafer W position on the stage 41, without complicated work that a person guides the pair of arms 611 to the wafer W position on the stage 41 while visually checking the position. Therefore, time required for a teaching work can be remarkably shortened, and variation in accuracy of the work can be prevented.

Additionally, according to the embodiment, the control part 15, after moving the pair of arms 611 such that the arm-side position sensors 43a to 43d move to the calculated position coordinates, controls the operation of the arm-moving mechanism 49 to adjust the position of the pair of arms 611 such that the proximity amounts outputted from the proximity sensors 44a to 44d and 45a to 45d approach the predetermined value, so that the teaching work can be performed with finer accuracy than measurement accuracy of the position sensors 42 and 43a to 43d.

Furthermore, according to the embodiment, the pair of arms 611 are attached with a plurality of arm-side position sensors 43a to 43d. Therefore, when there is an assembly defect in the pair of arms 611, the problem can be found out by receiving a position signal from each of the arm-side position sensors 43a to 43d to determine a position coordinate of each of the arm-side position sensors 43a to 43d, and comparing the determined position coordinates with each other.

Furthermore, according to the embodiment, since the arm-side position sensors 43a to 43d and the dummy-wafer-side position sensor 42 are three-dimensional position sensors, the teaching work can be performed in a short time without variation in accuracy with respect to all directions (i.e., X-, Y-, and Z-directions) in a three-dimensional space.

Although, in the embodiment, the proximity sensors (light-emitting portions) 44a to 44d are attached to the pair of arms 611 while the proximity sensors (light-receiving portions) 45a to 45d are attached to the dummy wafer 48, without being limited by this, the proximity sensors (light-receiving portions) 45a to 45d may be attached to the pair of arms 611 while the proximity sensors (light-emitting portions) 44a to 44d may be attached to the dummy wafer 48. Additionally, both of the proximity sensors (light-emitting portions) 44a to 44d and proximity sensors (light-receiving portions) 45a to 45d may be attached to the pair of arms 611, while the dummy wafer 48 may be attached with a mirror configured to reflect light outputted from the proximity sensors (light-emitting portions) 44a to 44d toward the proximity sensors (light-receiving portions) 45a to 45d. Alternatively, both of the proximity sensors (light-emitting portions) 44a to 44d and proximity sensors (light-receiving portions) 45a to 45d may be attached to the dummy wafer 48, while the pair of arms 611 may be attached with a mirror configured to reflect light outputted from the proximity sensors (light-emitting portions) 44a to 44d toward the proximity sensors (light-receiving portions) 45a to 45d.

Furthermore, among the four sets of proximity sensors (light-emitting portions and light-receiving portions) 44a to 44d and 45a to 44d, at least one set may be directed so as to transfer light in parallel with the X-direction, at least another set may be directed so as to transfer light in parallel with the Y-direction, and at least yet another set may be directed so as to transfer light in parallel with the Z-direction.

Although, in the embodiment described above, a polishing device for polishing a wafer is described as an example, this technology is not limited to a polishing device, and can be applied to other substrate processing apparatuses. For example, a plurality of polishing units may be replaced with another substrate processing unit (e.g., a film-forming processing unit such as a plating unit or a CVD unit, a wet etching unit, or a dry etching unit), to form a substrate processing apparatus different from a polishing device. Furthermore, a plurality of different substrate processing units may be combined and arranged in line in a predetermined direction.

Although preferred embodiments have been described above, it should be understood that the present technology is not limited to the illustrated embodiments, but changes and modifications can be made therein without departing from the technical idea.

What is claimed is:

1. A teaching system for performing teaching work at a cleaning unit having a plurality of cleaning modules of a wafer polishing device, the teaching system comprising:
   a stage provided in each cleaning module and on which a wafer is placed;
   a pair of openable/closable arms configured to hold the wafer;
   an arm-moving mechanism configured to move the pair of arms with respect to the stage;
   a control part configured to control an operation of the arm-moving mechanism;
   an arm-side position sensor attached to the pair of arms and configured to transmit a position signal;
   a dummy wafer placed on the stage;
   a dummy-wafer-side position sensor attached to the dummy wafer and configured to transmit a position signal; and
   a signal receiver configured to receive the position signal from the arm-side position sensor to determine a position coordinate of the arm-side position sensor based on the position signal from the arm-side position sensor, and receive the position signal from the dummy-wafer-side position sensor to determine a position coordinate of the dummy-wafer-side position sensor based on the position signal from the dummy-wafer-side position sensor, wherein
   for each cleaning module, the control part, based on the position coordinate of the dummy-wafer-side position sensor, calculates a position coordinate of the arm-side position sensor when the pair of arms hold the wafer, and controls the operation of the arm-moving mechanism to move the pair of arms to a standby position adjacent to a casing of the cleaning module and to move the pair of arms such that the arm-side position sensor moves to the calculated position coordinate, while checking the position coordinate, of the arm-side position sensor, that is determined from the position signal of the arm-side position sensor.

2. The teaching system according to claim 1, further comprising a proximity sensor attached to one or both of the dummy wafer and the pair of arms, the proximity sensor configured to output a proximity amount of the pair of arms with respect to the dummy wafer, wherein
   the control part, after moving the pair of arms such that the arm-side position sensor moves to the calculated position coordinate, controls the operation of the arm-moving mechanism to adjust the position of the pair of arms such that the proximity amount approaches a predetermined value.

3. The teaching system according to claim 1, wherein
   the pair of arms are attached with a plurality of the arm-side position sensors.

4. The teaching system according to claim 3, wherein
   the control part is configured to evaluate an assembled state of the pair of arms, by comparing the position coordinates from the arm-side position sensors with each other.

5. The teaching system according to claim 1, wherein
the arm-side position sensor and the dummy-wafer-side position sensor are three-dimensional position sensors.

6. A teaching method for performing teaching work at a cleaning unit having a plurality of cleaning modules of a wafer polishing device, the teaching method comprising the steps of:
for each cleaning module having a stage on which the wafer is placed,
receiving, a position signal from a dummy-wafer-side position sensor that is attached to a dummy wafer placed on the stage, to determine a position coordinate of the dummy-wafer-side position sensor based on the position signal from the dummy-wafer-side position sensor;
receiving a position signal from an arm-side position sensor attached to a pair of openable/closable arms configured to hold the wafer, to determine a position coordinate of the arm-side position sensor based on the position signal from the arm-side position sensor;
based on the position coordinate of the dummy-wafer-side position sensor, calculating a position coordinate of the arm-side position sensor when the pair of arms hold the wafer;
moving, by a control part configured to control an operation of an arm-moving mechanism, the pair of arms to a standby position adjacent to a casing of the cleaning module; and
moving the pair of arms such that the arm-side position sensor moves to the calculated position coordinate, while checking the position coordinate, of the arm-side position sensor, that is determined from the taosition signal of the arm-side nosition sensor.

7. The teaching method according to claim 6, further comprising the step of:
after moving the pair of arms such that the arm-side position sensor moves to the calculated position coordinate, acquiring a proximity amount of the pair of arms with respect to the dummy wafer from a proximity sensor attached to one or both of the dummy wafer and the pair of arms, and adjusting a position of the pair of arms such that the proximity amount approaches a predetermined value.

8. The teaching method according to claim 6, wherein the pair of arms are attached with a plurality of the arm-side position sensors.

9. The teaching method according to claim 8, further comprising the step of:
evaluating an assembled state of the pair of arms, by comparing the position coordinates from the arm-side position sensors with each other.

10. The teaching method according to claim 6, wherein the arm-side position sensor and the dummy-wafer-side position sensor are three-dimensional position sensor.

11. A cleaning device for performing teaching work at a cleaning unit having a plurality of cleaning modules of a wafer polishing device, the cleaning device comprising:
a stage provided in each cleaning module and on which a wafer is placed;
a cleaning mechanism configured to clean the water on the stage;
a pair of openable/closable arms configured to hold the wafer;
an arm-moving mechanism configured to move the pair of arms with respect to the stage;
a control part configured to control an operation of the arm-moving mechanism;
an arm-side position sensor attached to the pair of arms and configured to transmit a position signal;
a dummy wafer placed on the stage;
a dummy-wafer-side position sensor attached to the dummy wafer and configured to transmit a position signal; and
a signal receiver configured to receive the position signal from the arm-side position sensor to determine a position coordinate of the arm-side position sensor based on the position signal from the arm-side position sensor, and receive the position signal from the dummy-wafer-side position sensor to determine a position coordinate of the dummy-wafer-side position sensor based on the position signal from the dummy-wafer- side position sensor, wherein
for each cleaning module, the control part, based on the position coordinate of the dummy-wafer-side position sensor, calculates a position coordinate of the arm-side position sensor when the pair of arms hold the wafer, and controls the operation of the arm-moving mechanism to move the pair of arms to a standby position adjacent to a casing of the cleaning module and to move the pair of arms such that the arm-side position sensor moves to the calculated position coordinate, while checking the position coordinate, of the arm-side position sensor, that is determined from the position signal of the arm-side position sensor.

12. The cleaning device according to claim 11, wherein
the pair of arms are attached with a plurality of the arm-side position sensors, and
the control part is configured to evaluate an assembled state of the pair of arms, by comparing the position coordinates from the arm-side position sensors with each other.

13. A non-transitory storage medium configured to store a program for performing teaching work at a cleaning unit having a plurality of cleaning modules of a wafer polishing device, the program causing a computer to execute the steps of:
for each cleaning module having a stage on which a wafer is placed, receiving a position signal from a dummy-wafer-side position sensor that is attached to a dummy wafer placed on the stage, to determine a position coordinate of the dummy-wafer-side position sensor based on the position signal from the dummy-wafer-side position sensor;
receiving a position signal from an arm-side position sensor attached to the pair of openable/closable arms configured to hold the wafer, to determine a position coordinate of the arm-side position sensor based on the position signal from the arm-side position sensor;
based on the position coordinate of the dummy-wafer-side position sensor, calculating a position coordinate of the arm-side position sensor when the pair of arms hold the wafer;
moving, by a control part configured to control an operation of an arm-moving mechanism, the pair of arms to a standby position adjacent to a casing of the cleaning module; and
moving the pair of arms such that the arm-side position sensor moves to the calculated position coordinate, while checking the position coordinate, of the arm-side position sensor. that is determined from the position signal of the arm-side position sensor.

14. The non-transitory storage medium according to claim 13, wherein the pair of arms are attached with a plurality of the arm-side position sensors, and the program causes a computer to further execute the step of:

evaluating an assembled state of the pair of arms, by comparing the position coordinates from the arm-side position sensors with each other.

\* \* \* \* \*